(12) United States Patent
Yoo et al.

(10) Patent No.: US 11,887,986 B2
(45) Date of Patent: Jan. 30, 2024

(54) SEMICONDUCTOR MEMORY DEVICE

(71) Applicant: Samsung Electronics Co., Ltd., Suwon-si (KR)

(72) Inventors: Sungwon Yoo, Hwaseong-si (KR); Yongseok Kim, Suwon-si (KR); Ilgweon Kim, Hwaseong-si (KR); Hyuncheol Kim, Seoul (KR); Hyeoungwon Seo, Yongin-si (KR); Kyunghwan Lee, Seoul (KR); Jaeho Hong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 87 days.

(21) Appl. No.: 17/503,713

(22) Filed: Oct. 18, 2021

(65) Prior Publication Data
US 2022/0216239 A1 Jul. 7, 2022

(30) Foreign Application Priority Data
Jan. 4, 2021 (KR) ........................ 10-2021-0000269

(51) Int. Cl.
*H01L 27/12* (2006.01)
*H01L 25/065* (2023.01)
(Continued)

(52) U.S. Cl.
CPC .......... *H01L 27/1203* (2013.01); *H01L 21/84* (2013.01); *H01L 25/0657* (2013.01);
(Continued)

(58) Field of Classification Search
CPC . H01L 27/1203; H01L 21/84; H01L 25/0657; H01L 25/18; H01L 27/13; H01L 24/08; H10B 12/0335; H10B 12/05
(Continued)

(56) References Cited

U.S. PATENT DOCUMENTS

| 5,214,603 | A | 5/1993 | Dhong et al. |
| 5,918,120 | A | 6/1999 | Huang |

(Continued)

FOREIGN PATENT DOCUMENTS

| EP | 1213761 A1 | 6/2002 |
| TW | 2011/08399 A | 3/2011 |

OTHER PUBLICATIONS

Seongil Im, 'Trend and Issues of van der Waals 2D Semiconductor Devices' *Vacuum Magazine*, Jun. 2018, pp. 18-22.
(Continued)

*Primary Examiner* — Thinh T Nguyen
(74) *Attorney, Agent, or Firm* — Harness, Dickey & Pierce, P.L.C.

(57) ABSTRACT

A semiconductor memory device is disclosed. The semiconductor memory device may include a data storage layer including data storage devices, an interconnection layer disposed on the data storage layer, and a selection element layer provided between the data storage layer and the interconnection layer. The interconnection layer may include bit lines extending in a first direction. The selection element layer may include a cell transistor connected between one of the data storage devices and one of the bit lines, and the cell transistor may include an active pattern and a word line, which crosses the active pattern and is extended in a second direction crossing the first direction.

10 Claims, 38 Drawing Sheets

(51) Int. Cl.
 *H01L 21/84* (2006.01)
 *H01L 27/13* (2006.01)
 *H01L 25/18* (2023.01)
 *H01L 23/00* (2006.01)

(52) U.S. Cl.
 CPC .............. *H01L 25/18* (2013.01); *H01L 27/13* (2013.01); *H01L 24/08* (2013.01); *H01L 2224/08145* (2013.01)

(58) Field of Classification Search
 USPC ........................................ 257/43; 438/85, 86
 See application file for complete search history.

(56) References Cited

U.S. PATENT DOCUMENTS

| | | |
|---|---|---|
| 7,763,924 B2 | 7/2010 | Huang |
| 7,939,876 B2 | 5/2011 | Cheng et al. |
| 8,492,819 B2 | 7/2013 | Anderson et al. |
| 9,437,697 B2 | 9/2016 | Cho |
| 10,115,727 B2 | 10/2018 | Mueller et al. |
| 2011/0042722 A1 | 2/2011 | Renn et al. |
| 2013/0221356 A1* | 8/2013 | Yamazaki et al. ...... H01L 27/04 257/57 |
| 2015/0102395 A1 | 4/2015 | Park et al. |
| 2018/0123038 A1 | 5/2018 | Lee et al. |
| 2020/0161294 A1 | 5/2020 | Lee et al. |
| 2020/0168610 A1 | 5/2020 | Lu |
| 2020/0295009 A1 | 9/2020 | Lu |

OTHER PUBLICATIONS

Kenji Nomura et al., 'Room-temperature fabrication of transparent flexible thin-film transistors using amorphous oxide semiconductors' *Nature*, vol. 432, Nov. 2004, pp. 488-492.

Daniel S. Schulman et al., 'Contact engineering for 2D materials and devices' *Chem. Soc. Rev.,* vol. 47, No. 9, May 2018, pp. 3037-3058.

* cited by examiner

FIG. 3
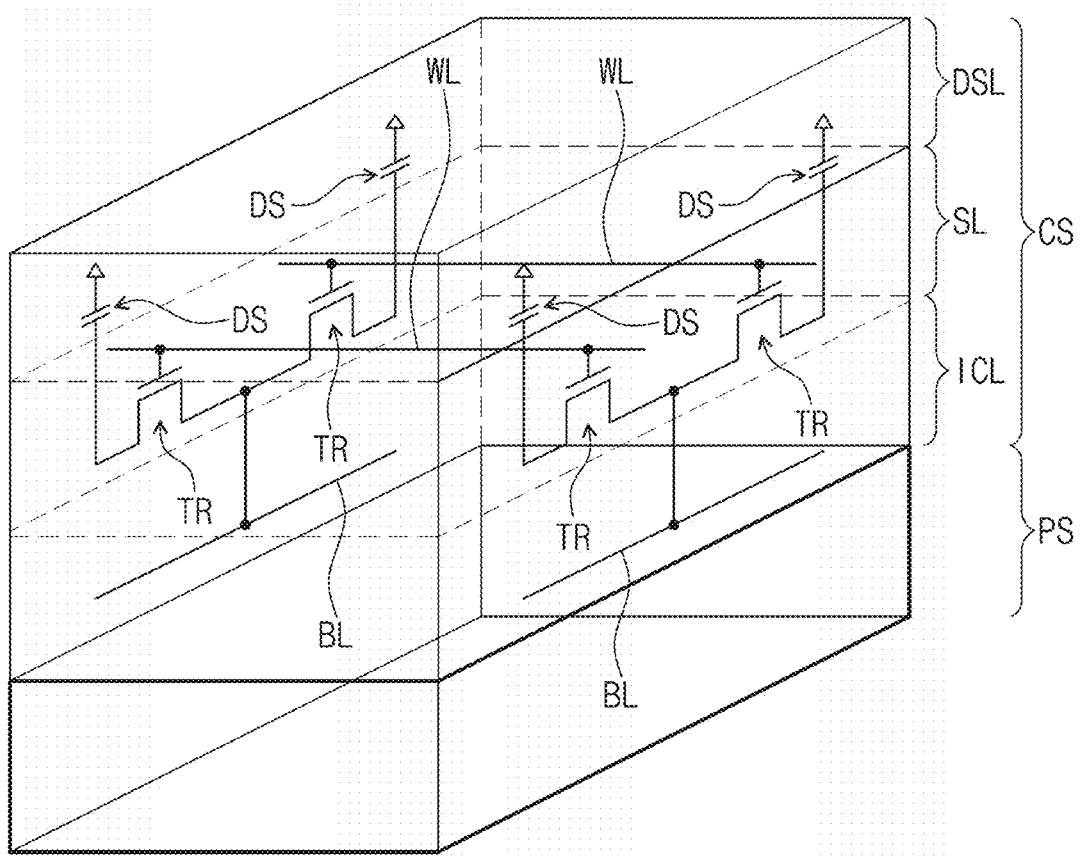
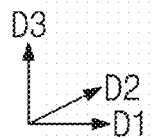

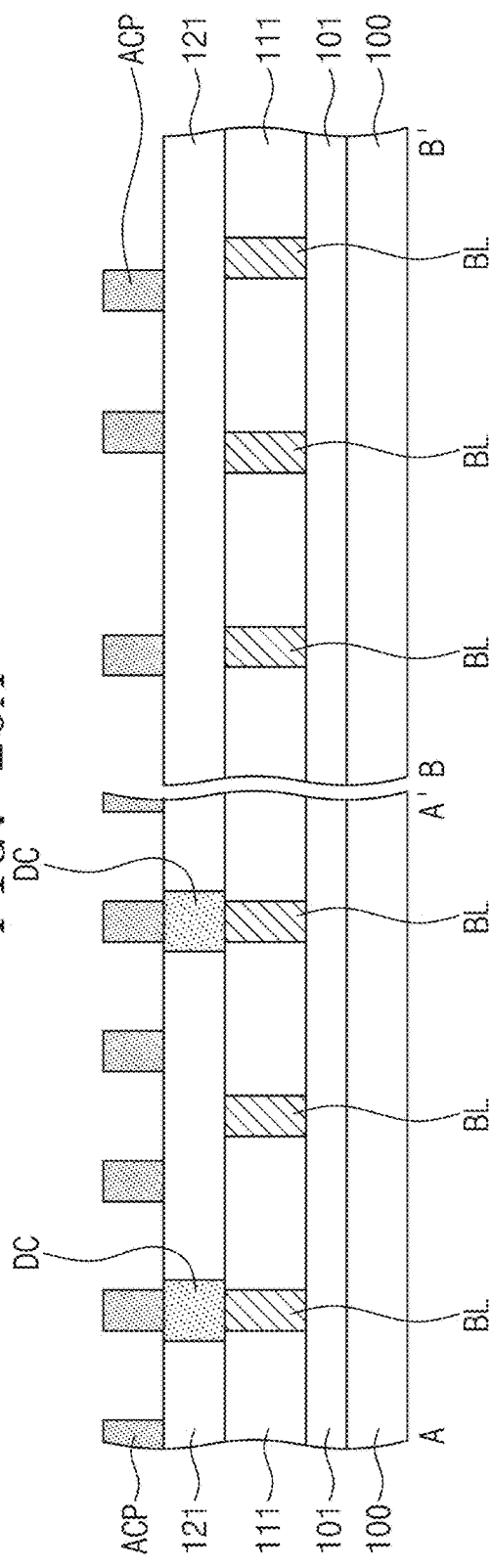
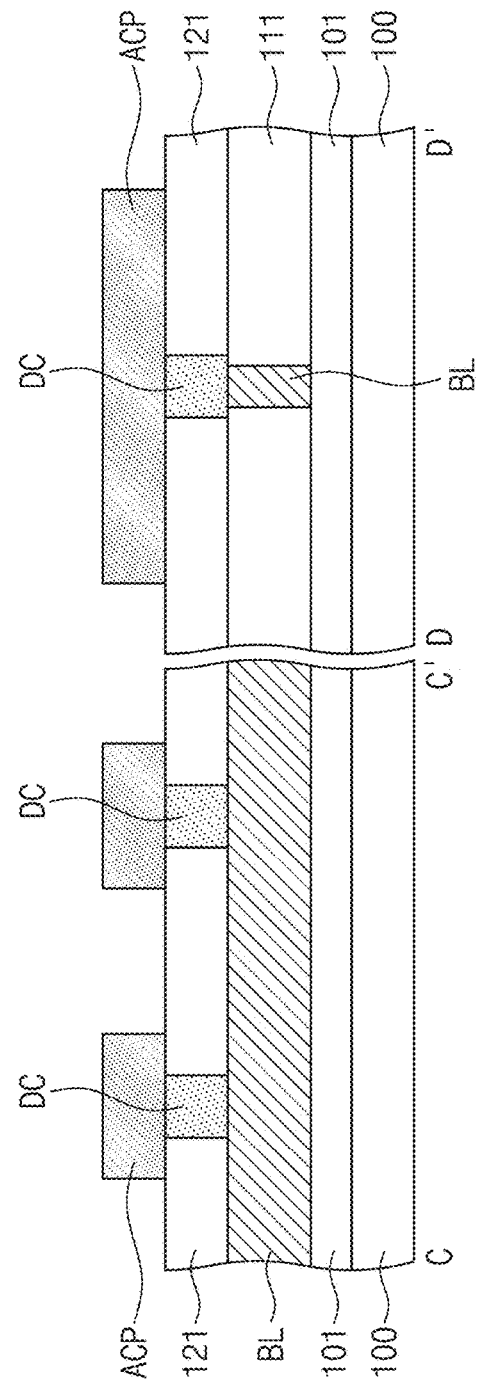

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2021-0000269, filed on Jan. 4, 2021, in the Korean Intellectual Property Office, the entire contents of which are hereby incorporated by reference.

BACKGROUND

The present disclosure relates to a semiconductor memory device, and in particular, to a semiconductor memory device including a transistor with an oxide semiconductor channel and a method of fabricating the same.

As a semiconductor device is scaled down, it may be necessary to develop a fabrication technology capable of increasing an integration density of a semiconductor device and improving an operation speed and a yield. Accordingly, a transistor with an oxide semiconductor channel has been proposed to improve an integration density, an electrical resistance property, and a current driving ability of a transistor.

SUMMARY

An embodiment of inventive concepts provides a semiconductor memory device with improved electric characteristics and/or high integration density.

According to an embodiment of inventive concepts, a semiconductor memory device may include a data storage layer including data storage devices, an interconnection layer on the data storage layer, and a selection element layer between the data storage layer and the interconnection layer. The interconnection layer may include bit lines extending in a first direction. The selection element layer may include a cell transistor connected between a corresponding one of the data storage devices and a corresponding one of the bit lines, and the cell transistor may include an active pattern and a word line. The word line may cross the active pattern and extend in a second direction crossing the first direction. The data storage layer, the selection element layer, and the interconnection layer may be sequentially disposed in a third direction. The third direction may be perpendicular to the first direction and the second direction.

According to an embodiment of inventive concepts, a semiconductor memory device may include an interlayer insulating layer, an active pattern on the interlayer insulating layer, a first word line and a second word line on the interlayer insulating layer and crossing the active pattern, a first capacitor connected to a first end portion of the active pattern, a second capacitor connected to a second end portion of the active pattern, a bit line contact plug connected to the active pattern, and a bit line connected to the bit line plug. The first word line and the second word line may enclose a side surface of the active pattern and a top surface of the active pattern. The first word line and the second word line may extend in a first direction. The bit line plug may be between the first word line and the second word line. The bit line may extend in a second direction and may cross the first word line and the second word line.

According to an embodiment of inventive concepts, a semiconductor memory device may include a semiconductor substrate, a plate conductive layer on the semiconductor substrate, a lower insulating layer, capacitors on the plate conductive layer and buried in a lower insulating layer, an interlayer insulating layer on the lower insulating layer and covering the capacitors, contact pads connected to the capacitors respectively, an active pattern on the interlayer insulating layer, a first word line and a second word line on the interlayer insulating layer and crossing the active pattern, a bit line contact plug contacting a top surface of the active pattern between the first word line and the second word line, and a bit line contacting a top surface of the bit line contact plug. The contact pads may penetrate the interlayer insulating layer. Opposite end portions of the active pattern may be in contact with top surfaces of the contact pads. The first word line and the second word line may enclose a side surface of the active pattern and the top surface of the active pattern. The bit line may cross the first word line and the second word line.

BRIEF DESCRIPTION OF THE DRAWINGS

FIGS. 2 and 3 are perspective views schematically illustrating semiconductor memory devices according to embodiments of inventive concepts.

FIGS. 10A to 17A and FIGS. 10B to 17B are sectional views, which are respectively taken along the lines A-A', B-B', C-C', and D-D' of FIG. 4 to illustrate a method of fabricating a semiconductor memory device according to an embodiment of inventive concepts.

FIGS. 18A to 23A and FIGS. 18B to 23B are sectional views, which are respectively taken along the lines A-A', B-B', C-C', and D-D' of FIG. 7 to illustrate a method of fabricating a semiconductor memory device according to an embodiment of inventive concepts.

DETAILED DESCRIPTION

Example embodiments of inventive concepts will now be described more fully with reference to the accompanying drawings.

Figure 1:
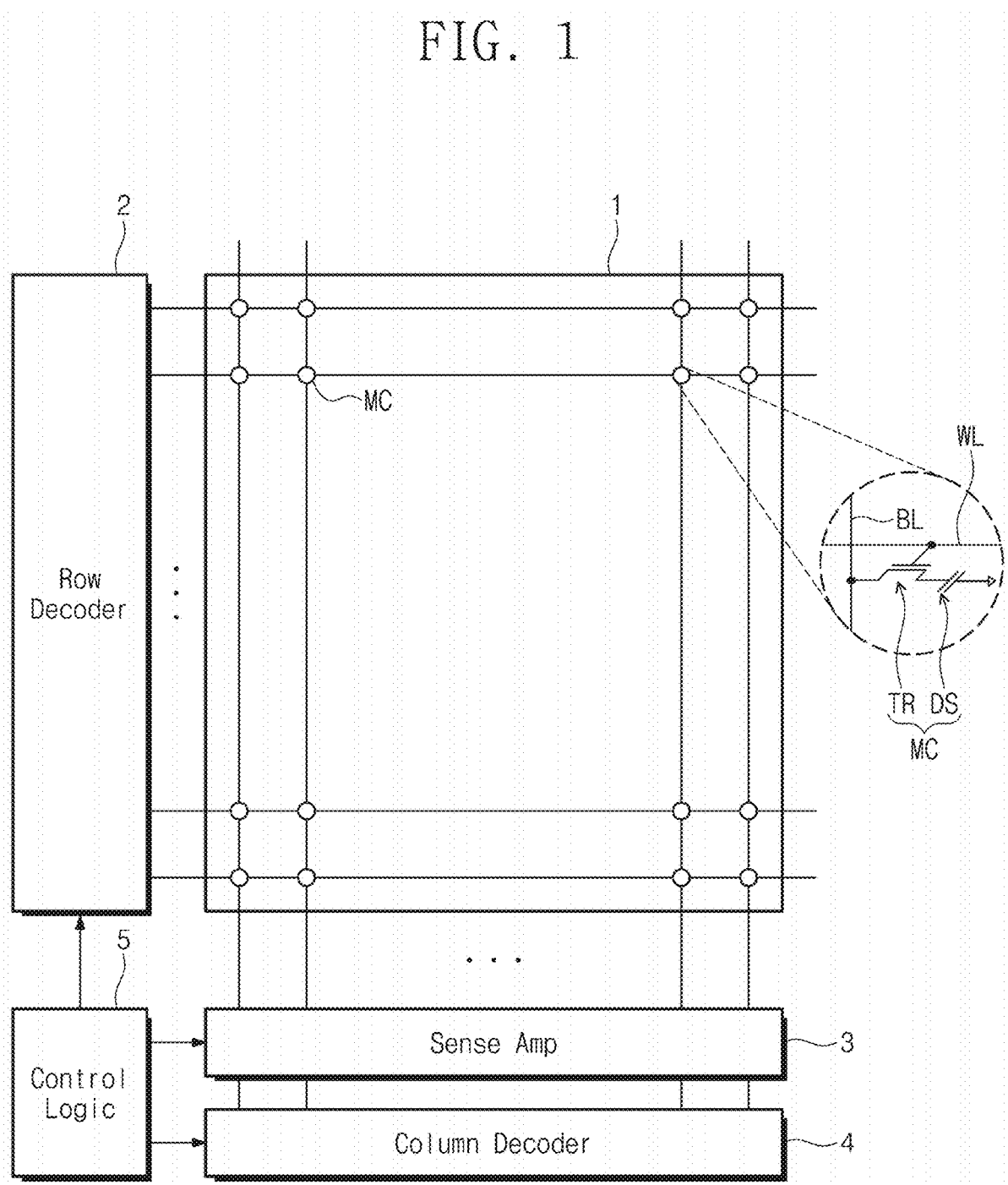
FIG. 1 is a block diagram illustrating a semiconductor memory device including a semiconductor device according to an embodiment of inventive concepts.

FIG. 1 is a block diagram illustrating a semiconductor memory device including a semiconductor device according to an embodiment of inventive concepts.

Referring to FIG. 1, a semiconductor memory device may include a memory cell array 1, a row decoder 2, a sense amplifier 3, a column decoder 4, and a control logic 5.

The memory cell array 1 may include a plurality of memory cells MC, which are two-dimensionally or three-dimensionally arranged. Each of the memory cells MC may be provided between and connected to a word line WL and a bit line BL, which are disposed to cross each other.

Each of the memory cells MC may include a selection element TR and a data storage device DS, which are electrically connected in series. The data storage device DS may be provided between and connected to the bit line BL and the selection element TR, and the selection element TR may be provided between and connected to the data storage device DS and the word line WL. The selection element TR may be a field effect transistor (FET), and the data storage device DS may be realized using at least one of a capacitor, a magnetic tunnel junction pattern, or a variable resistor. As an example, the selection element TR may include a transistor, a gate electrode of the transistor may be connected to the word line WL, and drain/source terminals of the transistor may be respectively connected to the bit line BL and the data storage device DS.

The row decoder 2 may be configured to decode address information, which is input from the outside, and to select one of the word lines WL of the memory cell array 1, based on the decoded address information. The address information decoded by the row decoder 2 may be provided to a row driver (not shown), and in this case, the row driver may provide respective voltages to the selected one of the word lines WL and the unselected ones of the word lines WL, in response to the control of a control circuit.

The sense amplifier 3 may be configured to sense, amplify, and output a difference in voltage between one of the bit lines BL, which is selected based on address information decoded by the column decoder 4, and a reference bit line.

The column decoder 4 may provide a data transmission path between the sense amplifier 3 and an external device (e.g., a memory controller). The column decoder 4 may be configured to decode address information, which is input from the outside, and to select one of the bit lines BL, based on the decoded address information.

The control logic 5 may be configured to generate control signals, which are used to control data writing or reading operations on the memory cell array 1.

Figure 2:
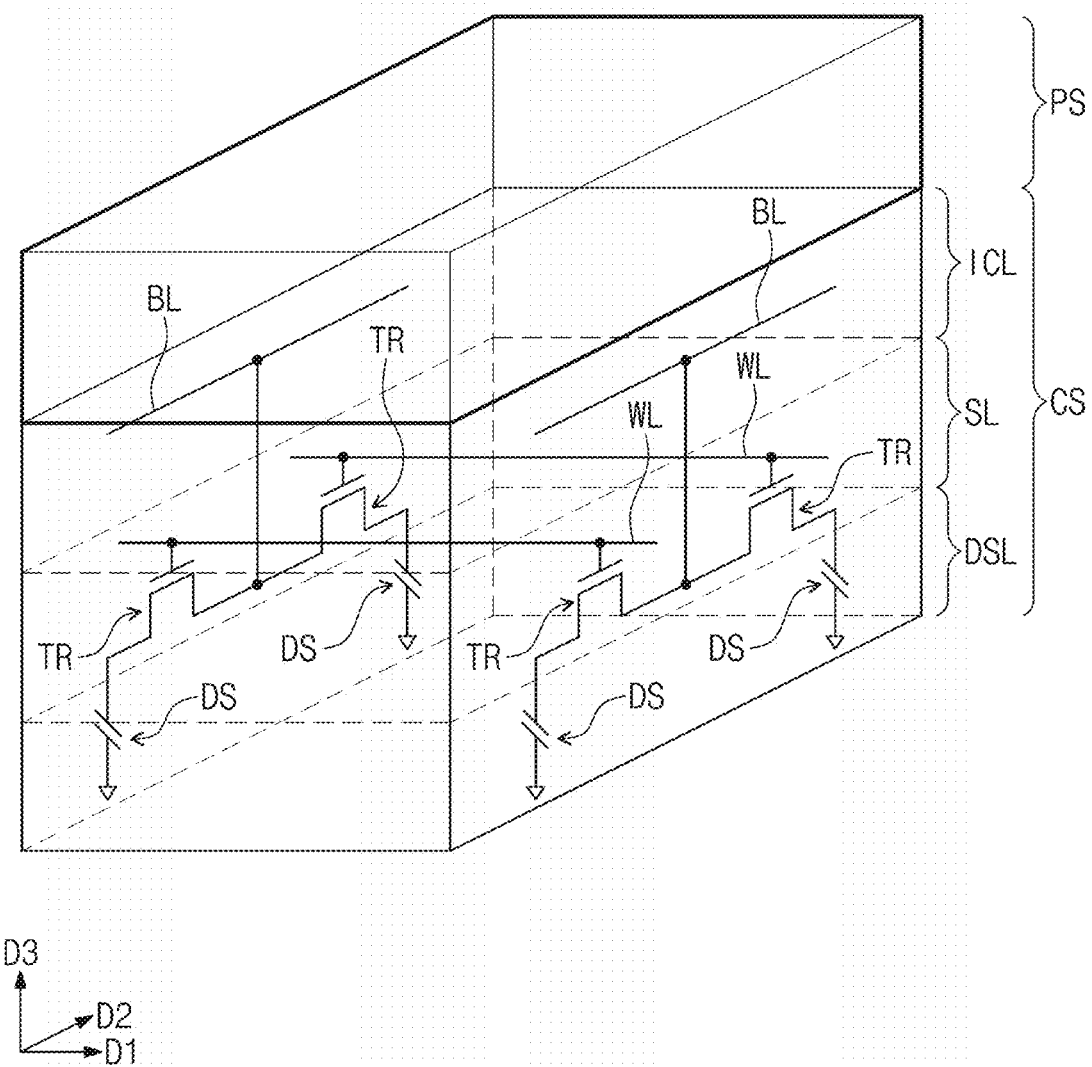

FIGS. 2 and 3 are perspective views schematically illustrating semiconductor memory devices according to embodiments of inventive concepts.

Referring to FIGS. 2 and 3, the semiconductor memory device may include a peripheral circuit structure PS on a semiconductor substrate 100 (e.g., see the substrate 100 in FIG. 5A) and a cell array structure CS on the peripheral circuit structure PS.

The peripheral circuit structure PS may include core and peripheral circuits, which are formed on the semiconductor substrate 100. The core and peripheral circuits may include the row and column decoders 2 and 4, the sense amplifier 3, and the control logics 5 described with reference to FIG. 1.

The cell array structure CS may include the memory cell array 1 (e.g., see FIG. 1) including the memory cells MC (e.g., see FIG. 1), which are two- or three-dimensionally arranged on a plane parallel to two different directions (e.g., first and second directions D1 and D2). Each of the memory cells MC (e.g., see FIG. 1) may include the selection element TR and the data storage device DS, as described above.

In an embodiment, a fin-shape field effect transistor (FET) may be provided as the selection element TR of each memory cell MC (e.g., see FIG. 1). A capacitor may be provided as the data storage device DS of each memory cell MC (e.g., see FIG. 1).

In the embodiment of FIG. 2, the cell array structure CS may include a data storage layer DSL, an interconnection layer ICL, and a selection element layer SL provided between the data storage layer DSL and the interconnection layer ICL. In other words, the cell array structure CS may include the data storage layer DSL, the selection element layer SL, and the interconnection layer ICL, which are sequentially stacked in a third direction D3 perpendicular to the first and second directions D1 and D2.

The data storage layer DSL may include the data storage devices DS of the memory cells MC. The interconnection layer ICL may include the bit lines BL, which are connected to the memory cells MC. The selection element layer SL may include the selection elements TR of the memory cells MC and the word lines WL connected to the selection elements TR.

The peripheral circuit structure PS may be stacked on the interconnection layer ICL of the cell array structure CS. That is, in the third direction D3, the interconnection layer ICL may be disposed between the peripheral circuit structure PS and the selection element layer SL.

Referring to FIG. 3, the cell array structure CS may be disposed on the peripheral circuit structure PS. The cell array structure CS may include the data storage layer DSL, the interconnection layer ICL, and the selection element layer SL between the data storage layer DSL and the interconnection layer ICL, as described above. In an embodiment, the interconnection layer ICL, the selection element layer SL, and the data storage layer DSL may be sequentially stacked on the peripheral circuit structure PS in the third direction D3.

Figure 4:
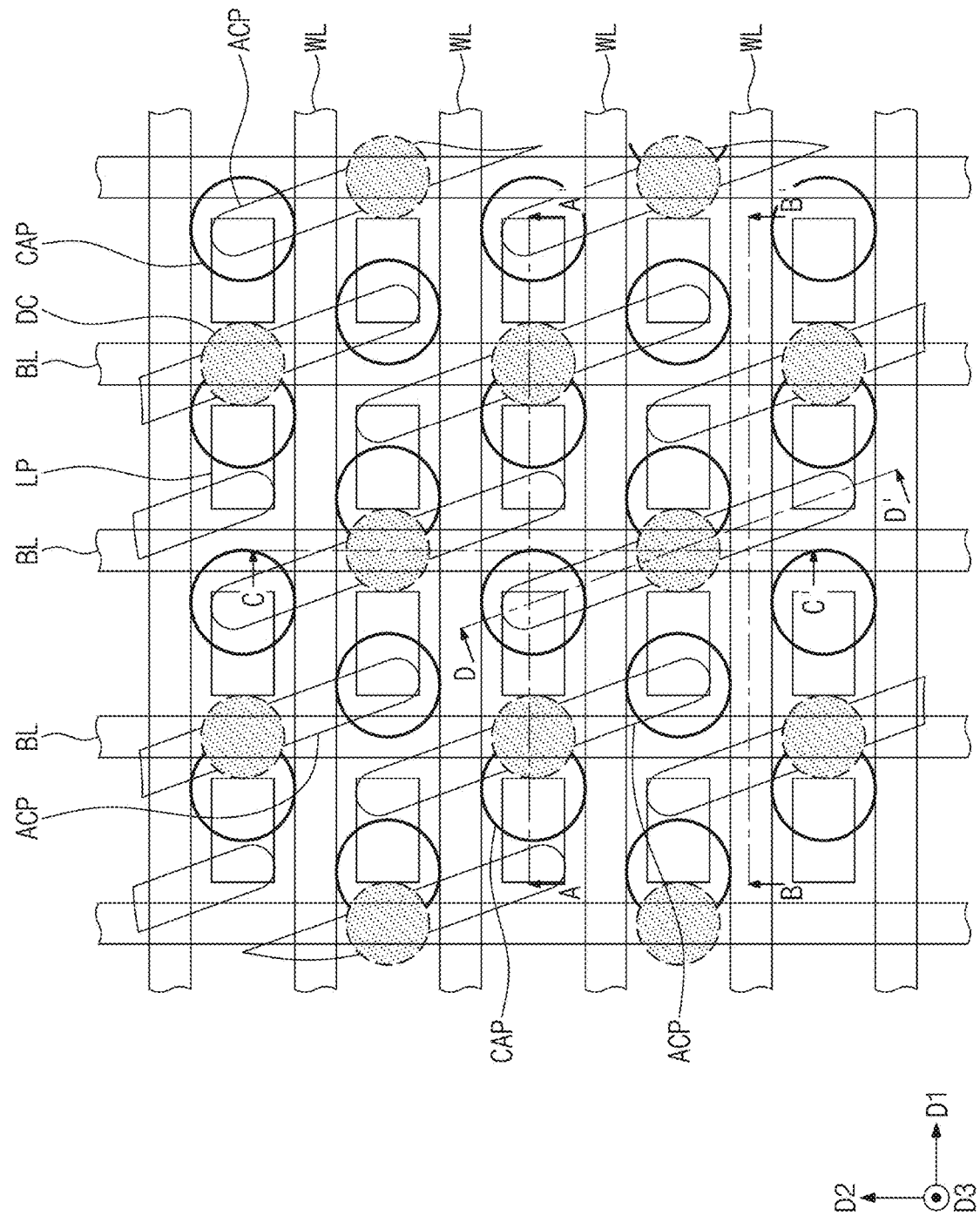
FIG. 4 is a plan view illustrating a semiconductor memory device according to an embodiment of inventive concepts.
Figure 5A:
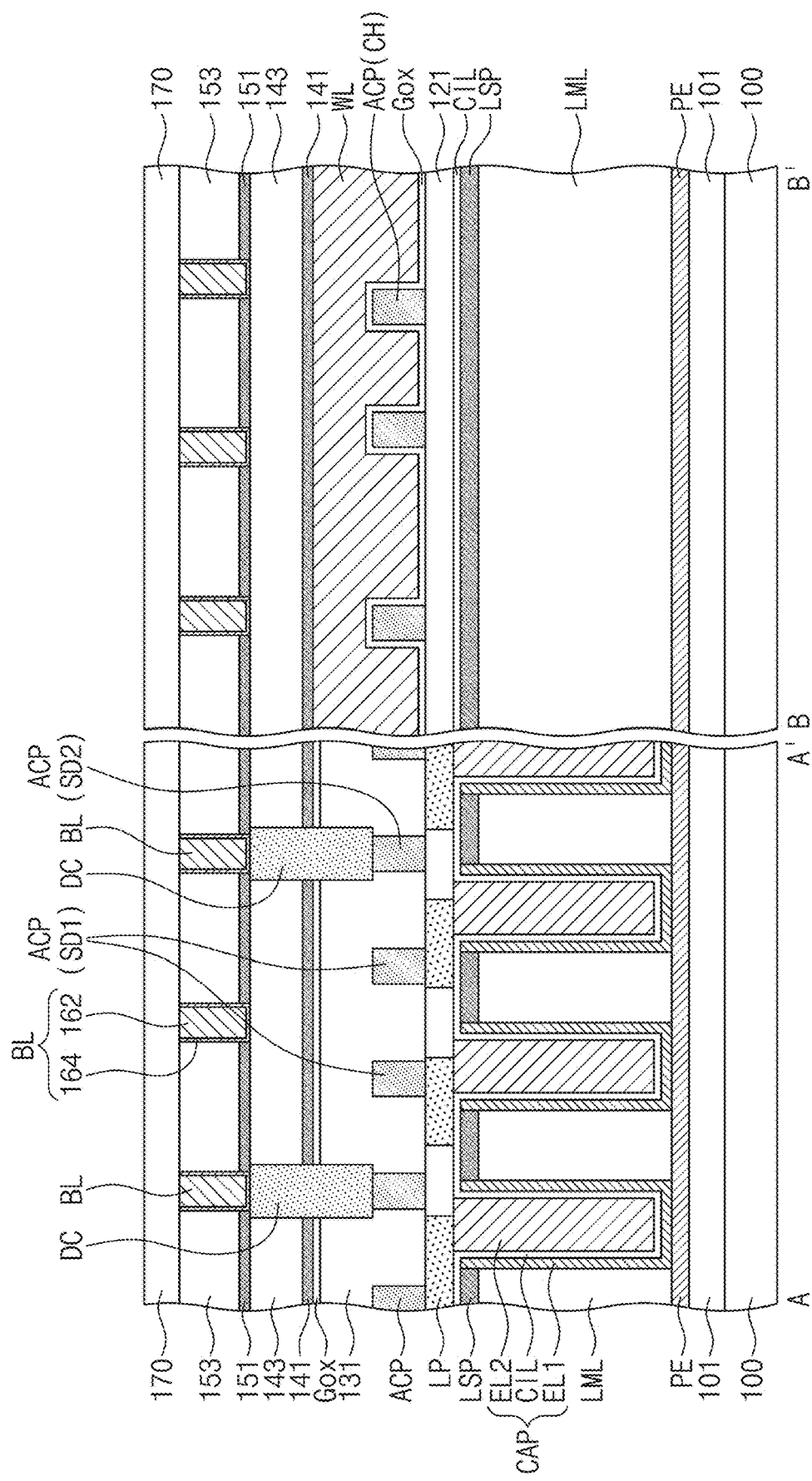
FIGS. 5A and 5B are sectional views which are taken along lines A-A', B-B', C-C', and D-D' of FIG. 4 to illustrate a semiconductor memory device according to an embodiment of inventive concepts.
Figure 5B:
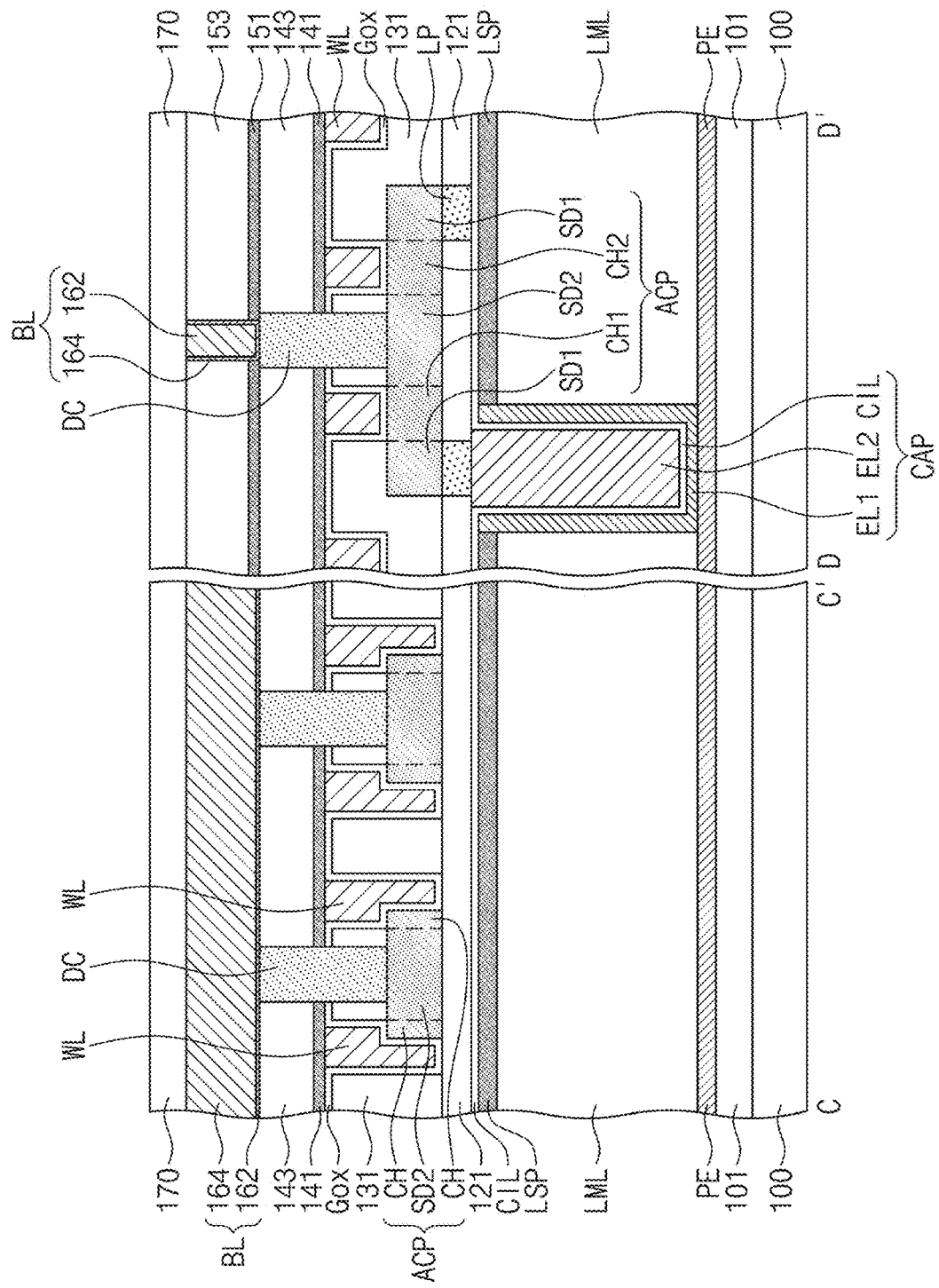

FIG. 4 is a plan view illustrating a semiconductor memory device according to an embodiment of inventive concepts. FIGS. 5A and 5B are sectional views which are taken along lines A-A', B-B', C-C', and D-D' of FIG. 4 to illustrate a semiconductor memory device according to an embodiment of inventive concepts.

Referring to FIGS. 4, 5A, and 5B, a lower insulating layer 101 may be provided to cover the semiconductor substrate 100, and capacitors CAP may be provided on the lower insulating layer 101.

In detail, a plate conductive layer PE may be disposed on the lower insulating layer 101, and a plurality of the capacitors CAP may be disposed on the plate conductive layer PE. The capacitors CAP may be connected in common to the plate conductive layer PE.

The plate conductive layer PE may have a plate shape extending in the first and second directions D1 and D2. The plate conductive layer PE may be formed of or include at least one of, for example, doped polysilicon, metals, conductive metal nitrides, conductive metal silicides, conductive metal oxides, or combinations thereof. For example, the plate conductive layer PE may be formed of or include at least one of Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but inventive concepts are not limited to this example.

A lower mold layer LML and a lower supporting layer LSP may be sequentially stacked on the plate conductive layer PE. The lower mold layer LML and the lower supporting layer LSP may be formed of insulating materials different from each other. The lower mold layer LML may include at least one of high density plasma (HDP) oxide, tetraethylorthosilicate (TEOS), plasma-enhanced TEOS (PE-TEOS), O3-TEOS, undoped silicate glass (USG), phosphosilicate glass (PSG), borosilicate glass (BSG), borophosphosilicate glass (BPSG), fluoride silicate glass (FSG), spin-on-glass (SOG), tonen silazene (TOSZ), or combinations thereof. The lower supporting layer LSP may be formed of or include at least one of, for example, SiN, SiCN, TaO, or $TiO_2$. In an embodiment, the lower supporting layer LSP may be omitted.

Each of the capacitors CAP may include a first electrode EL1 on the plate conductive layer PE, a second electrode EL2 on the first electrode EL1, and a capacitor dielectric layer CIL between the first and second electrodes EL1 and EL2.

In detail, a plurality of first electrodes EL1 may be disposed on the plate conductive layer PE, and the first electrodes EL1 may be connected in common to the plate conductive layer PE. Each of the first electrodes EL1 may include a horizontal portion, which is provided on the plate conductive layer PE, and a sidewall portion, which is vertically extended from the horizontal portion. For example, each of the first electrodes EL1 may have a cylindrical shape.

The first electrodes EL1 may be arranged in the first and second directions D1 and D2 on the plate conductive layer PE, and here, adjacent ones of the first electrodes EL1 may be arranged in a staggered manner. For example, the first electrodes EL1 may be arranged in a zigzag or honeycomb shape, when viewed in a plan view. The first electrodes EL1 may be formed of or include at least one of high melting point metals (e.g., cobalt, titanium, nickel, tungsten, and molybdenum) and/or metal nitrides (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN)).

The capacitor dielectric layer CIL may cover inner surfaces of the first electrodes EL1 to a uniform thickness and may cover a top surface of the lower supporting layer LSP. The capacitor dielectric layer CIL may be formed of at least one selected from the group consisting of metal oxides (e.g., $HfO_2$, $ZrO_2$, $Al_2O_3$, $La_2O_3$, $Ta_2O_3$ and $TiO_2$) and perovskite dielectric materials (e.g., $SrTiO_3$ (STO), $(Ba,Sr)TiO_3$ (BST), $BaTiO_3$, PZT, and PLZT) and may have a single- or multi-layered structure.

The second electrodes EL2 may fill the first electrodes EL1, in which the capacitor dielectric layer CIL is formed. Each of the second electrodes EL2 may have a pillar shape. When viewed in a plan view, the second electrodes EL2 may be arranged in a zigzag or honeycomb shape, similar to the first electrodes ELL The second electrodes EL2 may be formed of or include the same metallic material as the first electrodes ELL An interlayer insulating layer 121 may be provided to cover top surfaces of the second electrodes EL2 and portions of the capacitor dielectric layer CIL.

Contact pads LP may penetrate the interlayer insulating layer 121 and may be coupled to the second electrodes EL2 of the capacitors CAP, respectively. The contact pads LP may be in contact with portions of the second electrodes EL2, respectively. The contact pads LP may be disposed to be spaced apart from each other in the first and second directions D1 and D2. In an embodiment, the contact pads LP may have top surfaces that are coplanar with a top surface of the interlayer insulating layer 121.

The contact pads LP may be formed of or include at least one of high melting point metals (e.g., cobalt, titanium, nickel, tungsten, and molybdenum) and/or metal nitrides (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN)).

Although the contact pads LP are illustrated to have a rectangular shape, inventive concepts are not limited to this example. The shape of the contact pads LP may be variously changed to one of various shapes (e.g., rectangular, circular, or elliptical shapes).

Active patterns ACP may be disposed on the interlayer insulating layer 121. For example, the active patterns ACP may be located at a level higher than the capacitors CAP, when measured from a top surface of the semiconductor substrate 100.

The active patterns ACP may be disposed on the interlayer insulating layer 121 to be spaced apart from each other. The active patterns ACP may have a bar shape, on the interlayer insulating layer 121. Each of the active patterns ACP may have a long axis, which is parallel to a diagonal direction that is oblique to both of the first and second directions D1 and D2. Each of the active patterns ACP may have a height, which is defined as its length in a direction normal to a top surface of the interlayer insulating layer 121, and a length and a width, which are respectively defined as its lengths in the long axis and in a short axis (e.g., orthogonal to the long axis).

Each of the active patterns ACP may be in contact with a pair of the contact pads LP. Opposite end portions of each of the active patterns ACP may be in contact with top surfaces of the contact pads LP, and a central portion of each of the active patterns ACP may be disposed between two adjacent ones of the contact pads LP.

The active patterns ACP have been described to have the long axis parallel to the diagonal direction and to be arranged in the zigzag shape, but inventive concepts are not limited to this example. That is, the shape and arrangement of the active patterns ACP may be variously changed.

Each of the active patterns ACP may include a common source/drain region SD2, first and second source/drain regions SD1, which are spaced apart from the common source/drain region SD2 and are provided at two opposite portions, a first channel region CH1, which is provided between the first source/drain region SD1 and the common source/drain region SD2, and a second channel region CH2, which is provided between the second source/drain region SD1 and the common source/drain region SD2.

As an example, the active patterns ACP may be formed of or include a semiconductor material (e.g., silicon, germanium, or silicon-germanium).

As another example, the active patterns ACP may be formed of or include at least one of oxide semiconductor materials (e.g., $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_x$-$In_yZn_zO$, $Ga_xZn_ySn_zO$, $Al_xZn_ySn_zO$, $Yb_xGa_yZn_zO$, $In_xGa_yO$, or combinations thereof). In an embodiment, the active patterns ACP may be formed of or include indium gallium zinc oxide (IGZO).

The active patterns ACP may include a single or multiple layer made of at least one of the oxide semiconductor materials. The active patterns ACP may be formed of or include an amorphous, single-crystalline, or poly-crystalline oxide semiconductor material. In an embodiment, the active patterns ACP may have a band gap energy that is greater than that of silicon. For example, the active patterns ACP may have a band gap energy of about 1.5 eV to 5.6 eV. As an example, when the active patterns ACP have a band gap energy of about 2.0 eV to 4.0 eV, they may have an optimized channel property. For example, the active patterns ACP may have a polycrystalline or amorphous structure, but inventive concepts are not limited to this example.

As other example, the active patterns ACP may be formed of or include at least one of two-dimensional semiconductor materials (e.g., metal di-chalcogenide(TMDC)(MX$_2$), black phosphorous, MoS$_2$, MoTe$_2$, WS$_2$, WSe$_2$, graphene, carbon nanotube, or combinations thereof).

The word lines WL may be disposed on the interlayer insulating layer 121 and may be extended in the first direction D1. The word lines WL may be located at a level higher than the capacitors CAP, when measured from the top surface of the semiconductor substrate 100.

A pair of the word lines WL may be disposed to cross the first and second channel regions CH1 and CH2 of each of the active patterns ACP. In each of the active patterns ACP, the first channel region CH1 may be controlled by a first word line, and the second channel region CH2 may be controlled by a second word line.

The word lines WL may enclose side and top surfaces of the active patterns ACP and may be extended in the first direction D1. Also, each of the word lines WL may have a first thickness on the active pattern ACP and may have a second thickness, which is larger than the first thickness, on the interlayer insulating layer 121. Top surfaces of the word lines WL may be located at a level higher than top surfaces of the active patterns ACP.

The word lines WL may be formed of or include at least one of, for example, doped polysilicon, metals, conductive metal nitrides, conductive metal silicides, conductive metal oxides, or combinations thereof. The word lines WL may be formed of or include at least one of Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but inventive concepts are not limited to this example. The word lines WL may be a single or multiple layer made of at least one of the afore-described materials. In an embodiment, the word lines WL may be formed of or include at least one of two-dimensional semiconductor materials (e.g., metal di-chalcogenide(TMDC) (MX$_2$), black phosphorous, MoS$_2$, MoTe$_2$, WS$_2$, WSe$_2$, graphene, carbon nanotube, or combinations thereof).

A gate insulating layer Gox may be disposed between the word lines WL and the active patterns ACP and between the word lines WL and the interlayer insulating layer 121. The gate insulating layer Gox may have substantially the same thickness on the side and top surfaces of the active patterns ACP.

The gate insulating layer Gox may be formed of or include at least one of silicon oxide, silicon oxynitride, or high-k dielectric materials, or combinations thereof. The high-k dielectric materials may have dielectric constants higher than that of silicon oxide and may include metal oxides or metal oxynitrides. For example, the high-k dielectric material for the gate insulating layer Gox may include HfO$_2$, HfSiO, HfSiON, HfTaO, HfTiO, HfZrO, ZrO2, Al$_2$O$_3$, or combinations thereof, but inventive concepts are not limited to this example.

Although not shown, at least one of a high-k dielectric pattern, a work function control pattern, a ferroelectric pattern, and a diffusion barrier pattern may be interposed between the word lines WL and the gate insulating layer Gox. The high-k dielectric pattern may be formed of or include at least one of metal oxides (e.g., hafnium oxide and aluminum oxide) whose dielectric constant is higher than a dielectric constant of a silicon oxide layer. The diffusion barrier pattern may include a metal nitride layer, such as a tungsten nitride layer, a titanium nitride layer, and a tantalum nitride layer.

A first upper insulating layer 131 may be provided on the interlayer insulating layer 121 to fill regions between the word lines WL. A top surface of the first upper insulating layer 131 may be located at a level which is substantially equal to or lower than the top surfaces of the word lines WL.

The gate insulating layer Gox may be extended from a bottom surface of each of the word lines WL to regions between the first upper insulating layer 131 and side surfaces of the word lines WL. In addition, the gate insulating layer Gox may further include a portion covering the top surface of the first upper insulating layer 131.

A first etch stop layer 141 and a second upper insulating layer 143 may be sequentially stacked on the first upper insulating layer 131. The first etch stop layer 141 may cover the top surfaces of the word lines WL. The first etch stop layer 141 may be formed of an insulating material different from the second upper insulating layer 143.

A bit line contact plug DC may be provided between a pair of the word lines WL to be in contact with a top surface of the active pattern ACP. For example, the bit line contact plug DC may be connected to the common source/drain region SD2 of each of the active patterns ACP. The bit line contact plug DC may penetrate the first upper insulating layer 131, the first etch stop layer 141, and the second upper insulating layer 143. The bit line contact plugs DC may be arranged in a zigzag shape, when viewed in a plan view. A width of the bit line contact plug DC may be larger than a width of each of the active patterns ACP.

A second etch stop layer 151 and a third upper insulating layer 153 may be sequentially stacked on the second upper insulating layer 143.

The bit lines BL may be disposed on the second upper insulating layer 143. In other words, the bit lines BL may be located at a level higher than the capacitors CAP and the word lines WL, when measured from the top surface of the semiconductor substrate 100. The bit lines BL may be provided on the second upper insulating layer 143 to cross the active patterns ACP and the word lines WL and to extend in the second direction D2. Each of the bit lines BL may be in contact with top surfaces of the bit line contact plugs DC, which are arranged in the second direction D2.

Each of the bit lines BL may include a metal line pattern 164 and a barrier metal pattern 162, which covers bottom and side surfaces of the metal line pattern 164 to a uniform thickness. The metal line pattern 164 may be formed of or include at least one of metallic materials (e.g., copper, aluminum, cobalt, titanium, nickel, tungsten, tantalum, and molybdenum). The barrier metal pattern 162 may be formed of or include at least one of metal nitrides (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN)).

The bit lines BL may be buried in the third upper insulating layer 153 and the second etch stop layer 151, and top surfaces of the bit lines BL may be substantially coplanar with the top surface of the third upper insulating layer 153. That is, side surfaces of the bit lines BL may be in direct contact with the third upper insulating layer 153. Since the bit lines BL are buried in the third upper insulating layer 153, a pitch of the bit lines BL may be increased. In this case, it may be possible to reduce a coupling capacitance between the bit lines BL, because there is no conductive element between the bit lines BL.

A fourth upper insulating layer 170 may be provided on the third upper insulating layer 153 to cover the top surfaces of the bit lines BL.

Figure 5C:
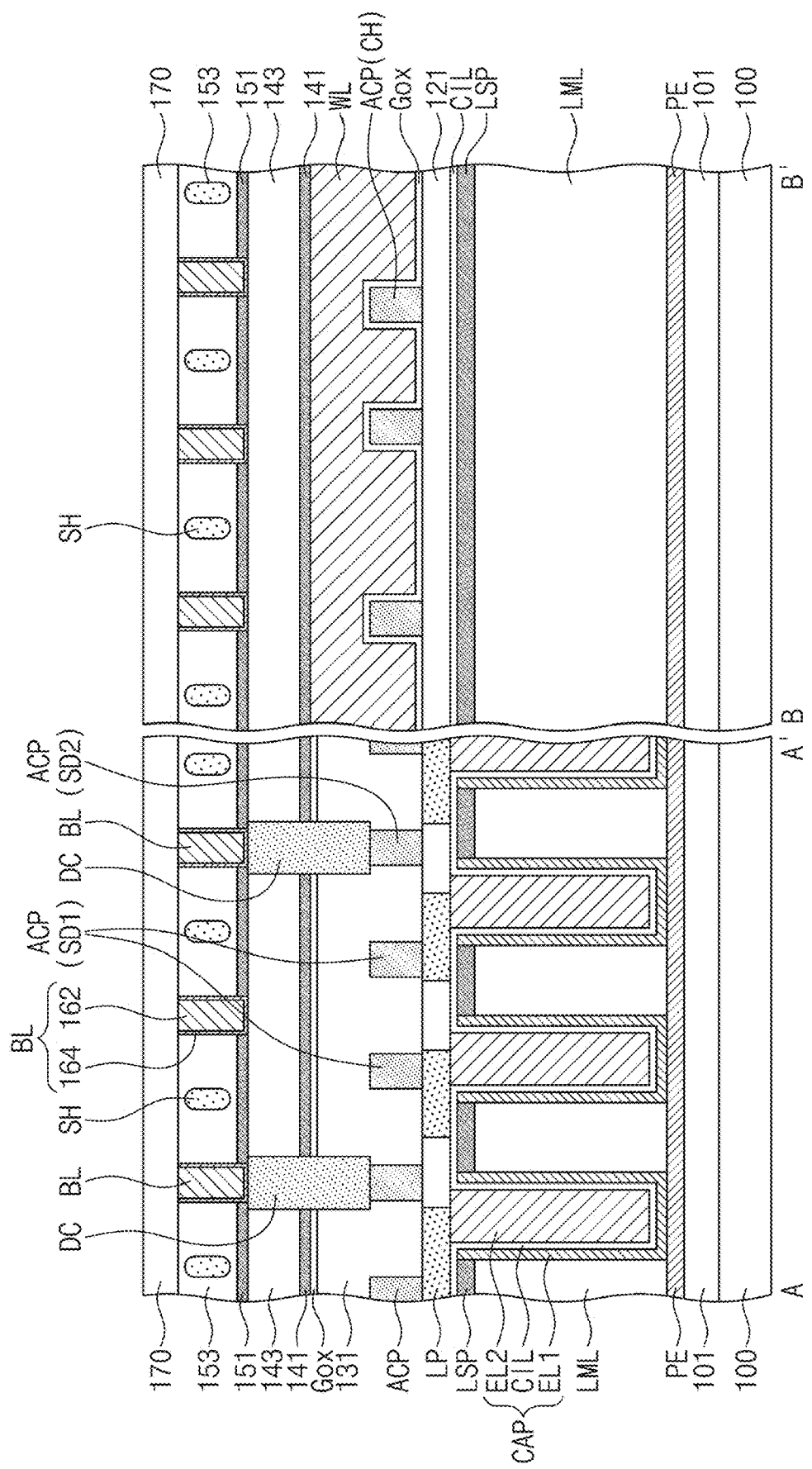
FIG. 5C is a sectional view which is taken along the lines A-A' and B-B' of FIG. 4 to illustrate a semiconductor memory device according to an embodiment of inventive concepts.

FIG. 5C is a sectional view which is taken along the lines A-A' and B-B' of FIG. 4 to illustrate a semiconductor memory device according to an embodiment of inventive concepts.

Referring to FIG. 5C, shielding structures SH may be respectively provided between adjacent ones of the bit lines BL. The shielding structures SH may be extended parallel to the bit lines BL or in the second direction D2. The shielding structures SH may be provided in portions of the third upper insulating layer 153 which are horizontally spaced apart from the bit lines BL.

The shielding structures SH may include a conductive material (e.g., a metal) or may be an empty space filled with the air. In the case where the shielding structures SH are formed of a conductive material, the formation of the shielding structures SH may include forming an insulating layer to define a gap region between the bit lines BL and filling the gap region of the insulating layer with a conductive material. In the case where the shielding structures SH is an empty space (e.g., an air gap), the shielding structures SH may be formed by depositing an insulating material using a deposition method having a poor step coverage property, after the formation of the bit lines BL. The shielding structures SH may reduce a coupling issue between adjacent ones of the bit lines BL, which may occur when an integration density of a semiconductor memory device is increased.

Figure 6:
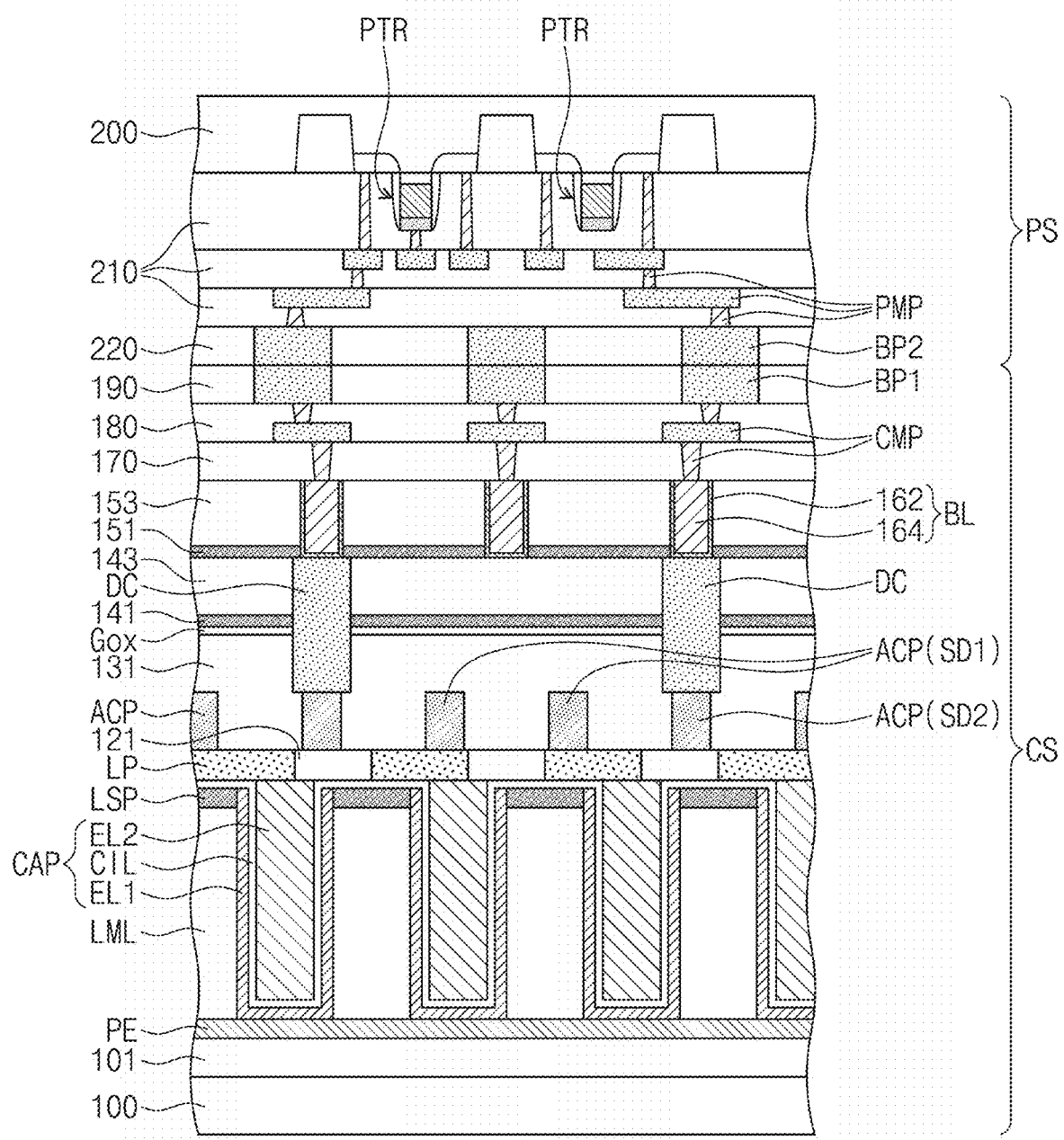
FIG. 6 is a sectional view illustrating a semiconductor memory device according to an embodiment of inventive concepts.

FIG. 6 is a sectional view illustrating a semiconductor memory device according to an embodiment of inventive concepts.

Referring to FIG. 6, the semiconductor memory device may include the cell array structure CS, which includes first bonding pads BP1, and the peripheral circuit structure PS, which include second bonding pads BP2 bonded with the first bonding pads BP1.

In detail, the cell array structure CS may include the data storage layer DSL, the selection element layer SL, and the interconnection layer ICL, which are sequentially stacked on the first semiconductor substrate 100, as described with reference to FIG. 2. Here, the data storage layer DSL (e.g., of FIG. 2) may include the capacitors CAP disposed on the first semiconductor substrate 100, and the selection element layer SL (e.g., of FIG. 2) may include fin field effect transistors, which are connected to the capacitors CAP, and the word lines WL. In addition, the interconnection layer ICL (e.g., of FIG. 2) may include the bit lines BL connected to the fin field effect transistors.

The cell array structure CS may include substantially the same elements as the semiconductor memory device described with reference to FIGS. 4, 5A, and 5B, and thus, for concise description, a previously described element may be identified by the same reference number without repeating an overlapping description thereof.

The first bonding pads BP1 may be provided in the highest layer of the cell array structure CS. The bit lines BL of the cell array structure CS may be electrically connected to the first bonding pads BP1 through cell metal structures CMP. The cell metal structures CMP may include at least two metal patterns, which are vertically stacked and are connected to each other, and metal plugs, which connect the metal patterns to each other. The cell metal structures CMP may be disposed in upper insulating layers 170 and 180. The first bonding pads BP1 may be disposed in an uppermost insulating layer 190. The first bonding pads BP1 may be formed of or include at least one of, for example, copper (Cu), aluminum (Al), nickel (Ni), cobalt (Co), tungsten (W), titanium (Ti), tin (Sn), or alloys thereof.

The peripheral circuit structure PS may include core and peripheral circuits PTR formed on a second semiconductor substrate 200. The core and peripheral circuits PTR may include the row and column decoders 2 and 4, the sensing amplifier 3, and the control logic 5 described with reference to FIG. 1.

The peripheral circuit structure PS may include peripheral insulating layers 210, which are stacked on the second semiconductor substrate 200, and the second bonding pads BP2, which are disposed in the uppermost one of the peripheral insulating layers 210. The second bonding pads BP2 may have substantially the same size and arrangement as the first bonding pads BP1. The second bonding pads BP2 may be formed of or include the same metallic material as the first bonding pads BP1. For example, the second bonding pads BP2 may be formed of or include at least one of copper (Cu), aluminum (Al), nickel (Ni), cobalt (Co), tungsten (W), titanium (Ti), tin (Sn), or alloys thereof.

The second bonding pads BP2 may be electrically connected to the core and peripheral circuits PTR through peripheral metal structures PMP, which are provided in the peripheral insulating layers 210. The peripheral metal structures PMP may include at least two metal patterns, which are vertically stacked and are connected to each other, and metal plugs, which connect the metal patterns to each other.

According to an embodiment of inventive concepts, the semiconductor memory device may be fabricated by forming the cell array structure CS including the memory cells on the first semiconductor substrate 100, forming the peripheral circuit structure PS including the core and peripheral circuits PTR on the second semiconductor substrate 200 that is distinct from the first semiconductor substrate 100, and connecting the first and second semiconductor substrates 100 and 200 to each other in a bonding manner. In other words, the first bonding pads BP1 of the cell array structure CS and the second bonding pads BP2 of the peripheral circuit structure PS may be electrically and physically connected to each other in a bonding manner. For example, the first bonding pads BP1 may be in direct contact with the second bonding pads BP2.

Figure 7:
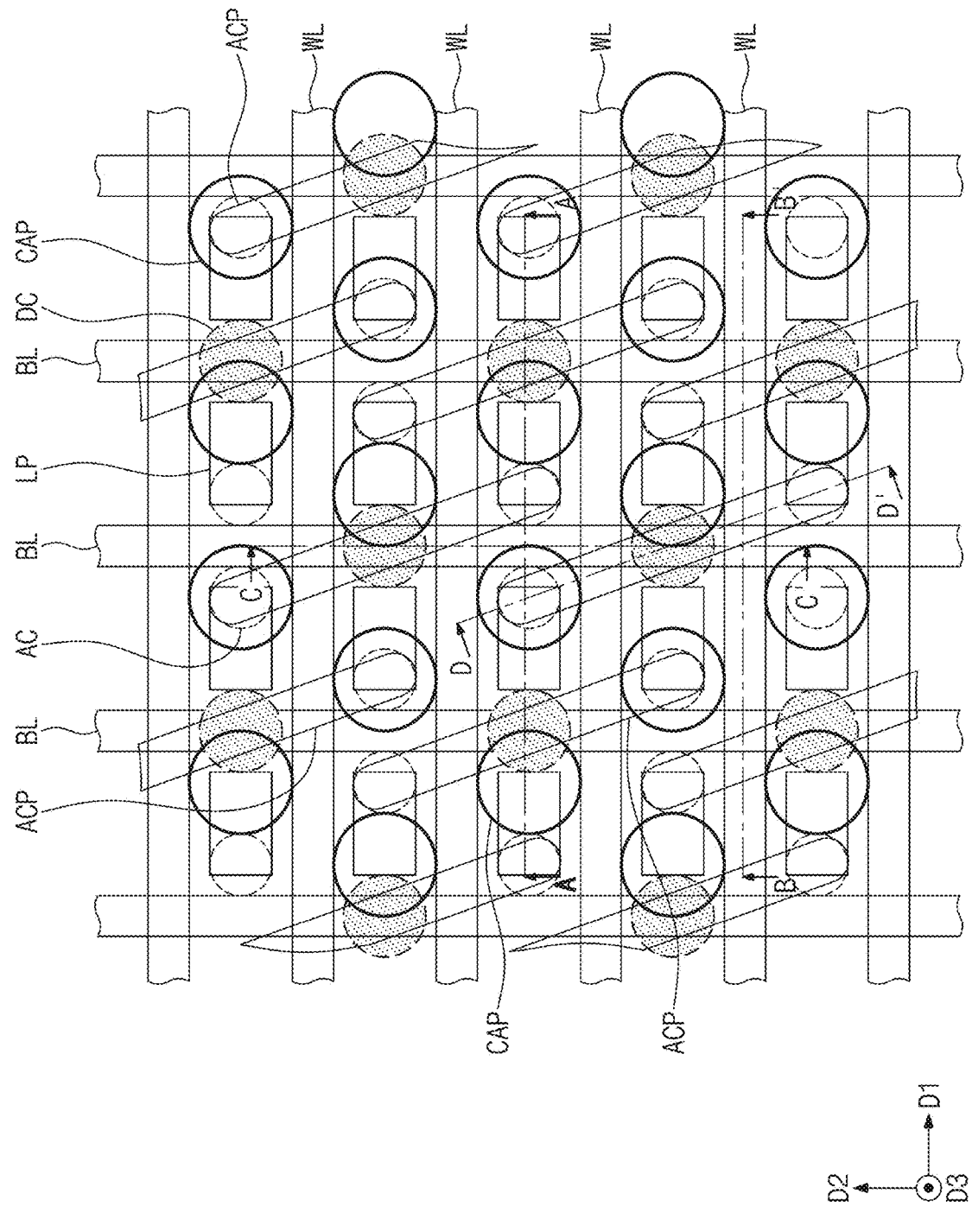
FIG. 7 is a plan view illustrating a semiconductor memory device according to an embodiment of inventive concepts.
Figure 8A:
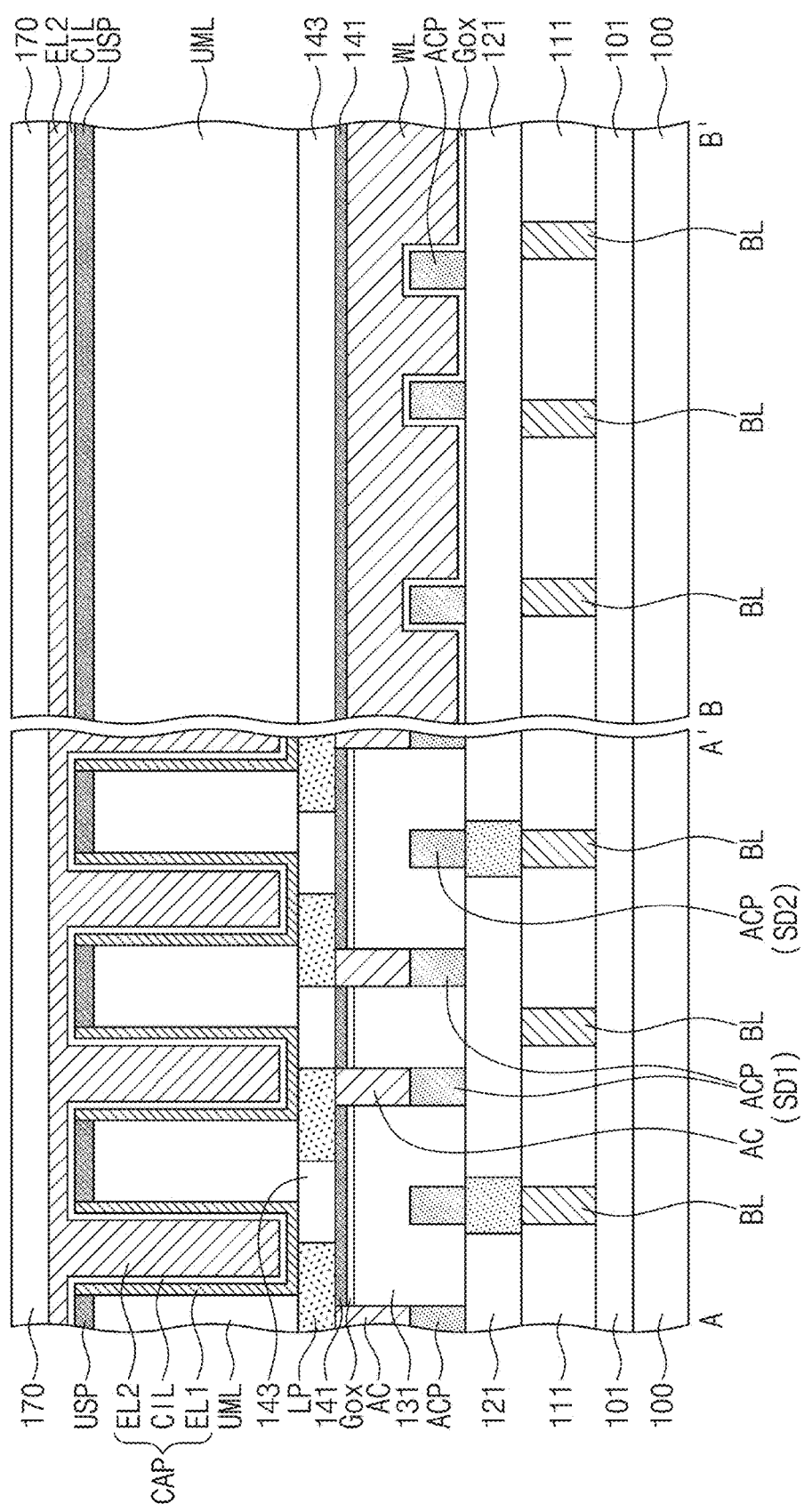
FIGS. 8A and 8B are sectional views which are taken along lines A-A', B-B', C-C', and D-D' of FIG. 7 to illustrate a semiconductor memory device according to an embodiment of inventive concepts.
Figure 8B:
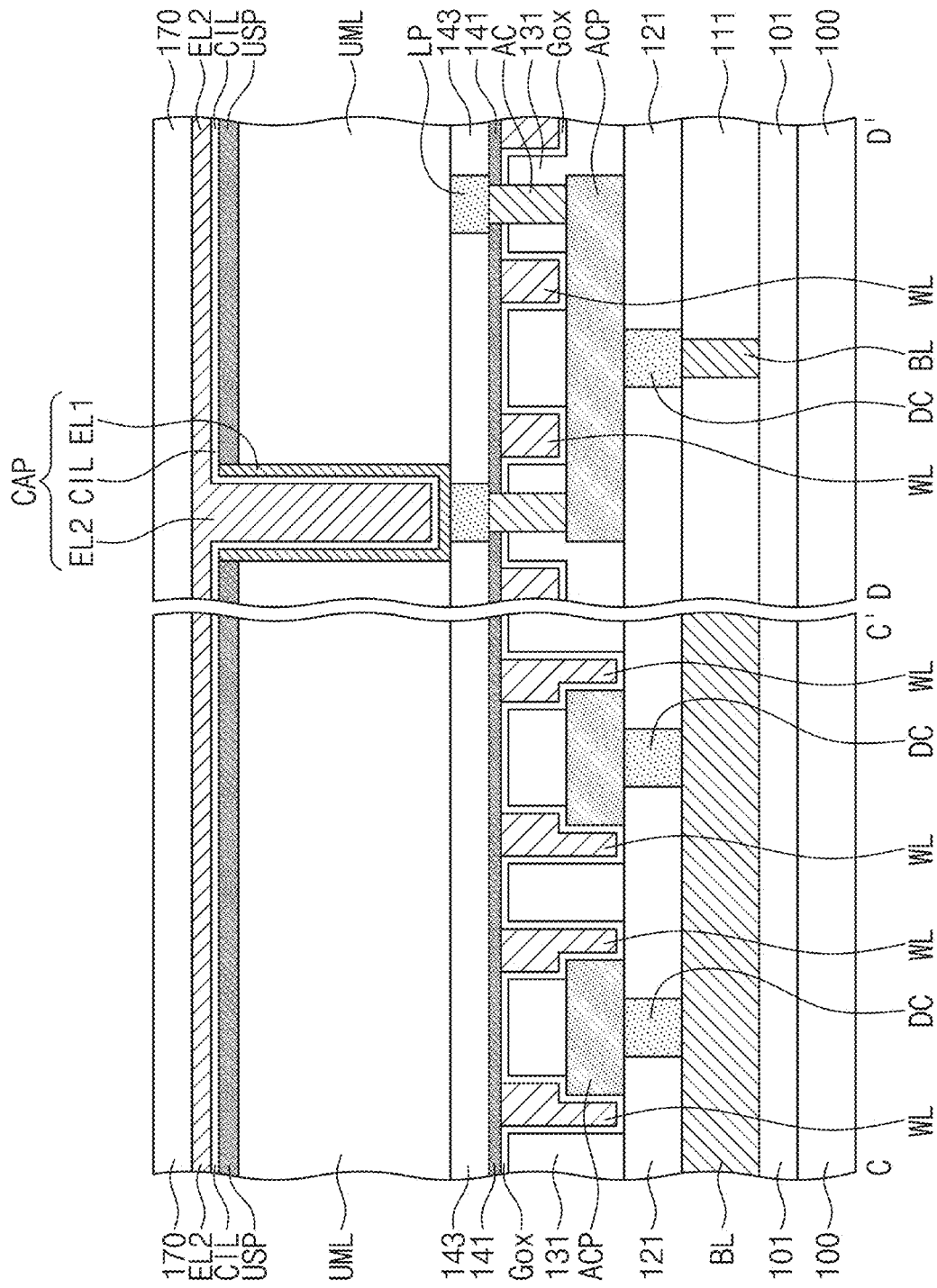

FIG. 7 is a plan view illustrating a semiconductor memory device according to an embodiment of inventive concepts. FIGS. 8A and 8B are sectional views which are taken along lines A-A', B-B', C-C', and D-D' of FIG. 7 to illustrate a semiconductor memory device according to an embodiment of inventive concepts.

Referring to FIGS. 7, 8A, and 8B, the first lower insulating layer 101 may be disposed on the semiconductor substrate 100, and the bit lines BL extending in the second direction D2 may be disposed on the lower insulating layer 101.

The bit lines BL may be disposed in a second lower insulating layer 111. The bit lines BL may have top surfaces which are coplanar with a top surface of the second lower insulating layer 111.

The interlayer insulating layer 121 may be disposed on the second lower insulating layer 111, and the bit line contact plugs DC may penetrate the interlayer insulating layer 121 and may be coupled to the bit lines BL.

The bit line contact plugs DC may be arranged to be spaced apart from each other in the first and second directions D1 and D2. In an embodiment, the bit line contact plugs DC may be arranged in a zigzag shape, when viewed in a plan view. The bit line contact plugs DC, which are arranged in the second direction D2, may be coupled to one of the bit lines BL. The bit line contact plugs DC may have a width which is larger than a width of the bit lines BL.

The active patterns ACP may be disposed on the interlayer insulating layer 121 to be spaced apart from each other. The active patterns ACP may be in contact with the top surfaces of the bit line contact plugs DC, respectively.

As described above, the active patterns ACP may have a bar shape and may have a long axis, which is parallel to a diagonal direction that is oblique to both of the first and second directions D1 and D2. Each of the active patterns ACP may include a common source/drain region, first and second source/drain regions, which are spaced apart from the common source/drain region and are provided at two opposite portions, a first channel region, which is provided between the first source/drain region and the common source/drain region, and a second channel region, which is provided between the second source/drain region and the common source/drain region.

The word lines WL may be disposed on the interlayer insulating layer 121 to cross the active patterns ACP. The word lines WL may be extended in the first direction D1 to cross the bit lines BL. The word lines WL may be located at a level higher than the bit lines BL, when measured from the top surface of the semiconductor substrate 100.

The word lines WL may enclose the side and top surfaces of the active patterns ACP and may be extended in the first direction D1, as described with reference to FIGS. 5A and 5B. A pair of the word lines WL may be provided to cross the first and second channel regions of each of the active patterns ACP.

The first upper insulating layer 131 may be disposed on the interlayer insulating layer 121 to fill regions between the word lines WL. The top surfaces of the word lines WL may be located at a level that is equal to or higher than the top surface of the first upper insulating layer 131.

The first etch stop layer 141 and the second upper insulating layer 143 may be sequentially formed on the first upper insulating layer 131. The first etch stop layer 141 may cover the top surfaces of the word lines WL. The first etch stop layer 141 may be formed of an insulating material which is different from the first and second upper insulating layers 131 and 143.

Active contacts AC may penetrate the first etch stop layer 141 and the first upper insulating layer 131 and may be in contact with the top surfaces of the active patterns ACP. The active contacts AC are illustrated to penetrate the first etch stop layer 141 and the first upper insulating layer 131, but the active contacts AC may be provided to penetrate the second upper insulating layer 143, the first etch stop layer 141, and the first upper insulating layer 131.

The active contacts AC may be coupled to two opposite portions of each of the active patterns ACP. For example, the active contacts AC may be coupled to the first and second source/drain regions of each of the active patterns ACP.

The contact pads LP may be disposed in the second upper insulating layer 143 and may be in contact with the active contacts AC. An area of the contact pad LP may be larger than an area of the active contact AC. As previously described with reference to FIGS. 5A and 5B, the contact pads LP may be disposed to be spaced apart from each other in the first and second directions D1 and D2 and may have a rectangular shape. The contact pads LP may have top surfaces which are located at substantially the same level as a top surface of the second upper insulating layer 143. In an embodiment, the contact pads LP may be omitted.

An upper mold layer UML and an upper supporting layer USP may be sequentially stacked on the second upper insulating layer 143, and the capacitors CAP may be buried in the upper mold layer UML. In other words, the capacitors CAP may be located at a level higher than the bit lines BL and the word lines WL, when measured from the top surface of the semiconductor substrate 100. The capacitors CAP may be disposed to be spaced apart from each other in the first and second directions D1 and D2 and may be arranged in a zigzag shape, when viewed in a plan view.

The capacitors CAP may include a plurality of the first electrodes EL1, the second electrode EL2 covering all of the first electrodes EL1, and the capacitor dielectric layer CIL between the first electrodes EL1 and the second electrode EL2.

The first electrodes EL1 of the capacitors CAP may penetrate the upper mold layer UML and may be in contact with the contact pads LP, respectively. In an embodiment, the contact pads LP may be omitted, and in this case, the first electrodes EL1 of the capacitors CAP may be in contact with the active contacts AC. Each of the first electrodes EL1 may include a horizontal portion, which is provided on the contact pad LP, and a sidewall portion, which is vertically extended from the horizontal portion. In other words, each of the first electrodes EL1 may have a cylindrical shape.

The capacitor dielectric layer CIL may cover the inner surfaces of the first electrodes EL1 and the top surface of the upper supporting layer USP to a uniform thickness. The second electrode EL2 may fill inner spaces of the first electrodes EL1 and may be extended to a region on the upper supporting layer USP. An upper insulating layer 170 may be disposed on the second electrode EL2 of the capacitors CAP.

Figure 8C:
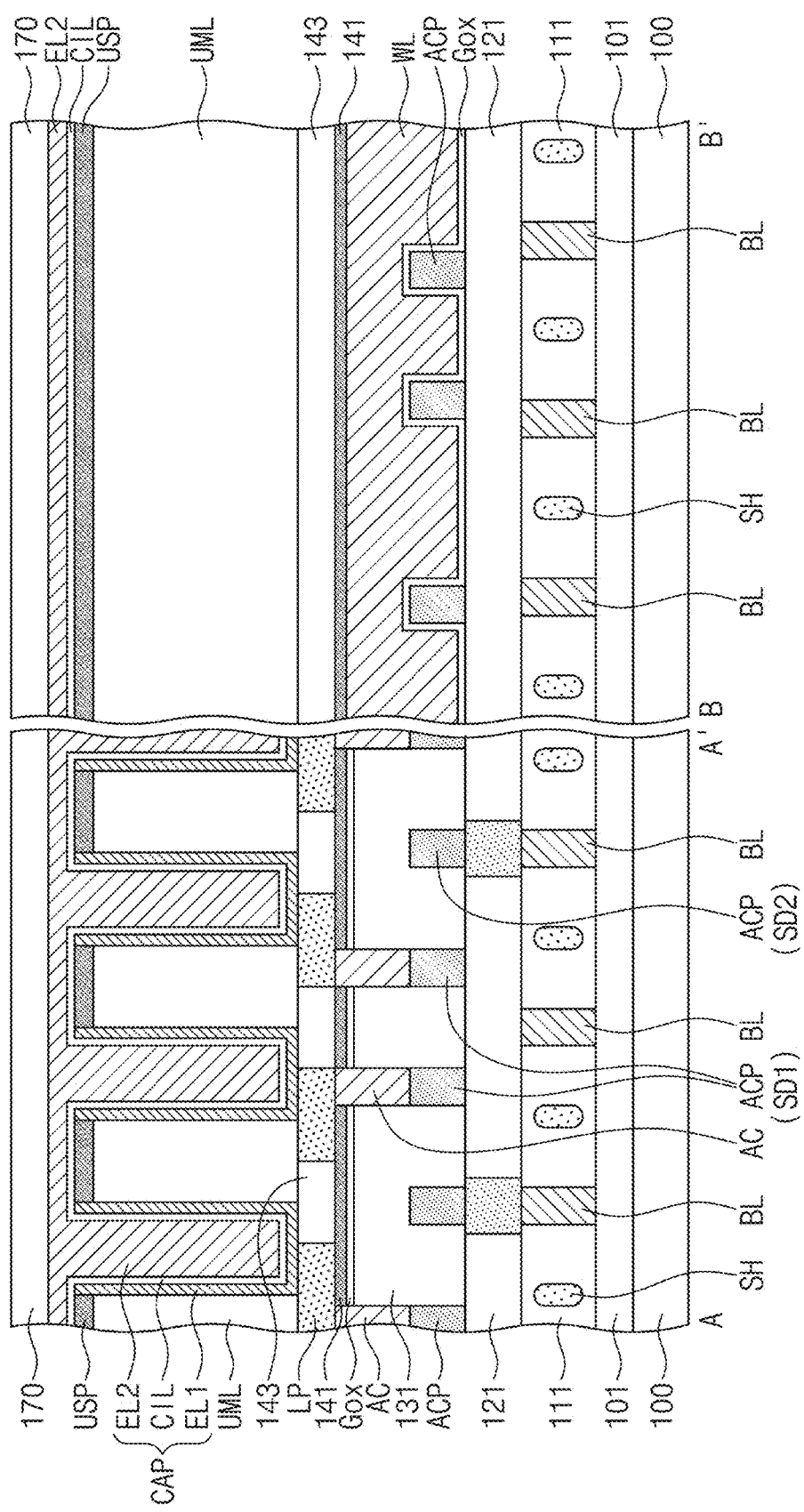
FIG. 8C is a sectional view which is taken along the lines A-A' and B-B' of FIG. 7 to illustrate a semiconductor memory device according to an embodiment of inventive concepts.

FIG. 8C is a sectional view which is taken along the lines A-A' and B-B' of FIG. 7 to illustrate a semiconductor memory device according to an embodiment of inventive concepts.

Referring to FIG. 8C, the shielding structures SH may be respectively provided in portions of the second lower insulating layer 111 which are located between adjacent ones of the bit lines BL. The shielding structures SH may be extended parallel to the bit lines BL or in the second direction D2. The shielding structures SH may be an isolated structure which is enclosed by an insulating material. The shielding structures SH may include a conductive material (e.g., a metal) or may be an empty space filled with the air, as previously described with reference to FIG. 5C.

Figure 9:
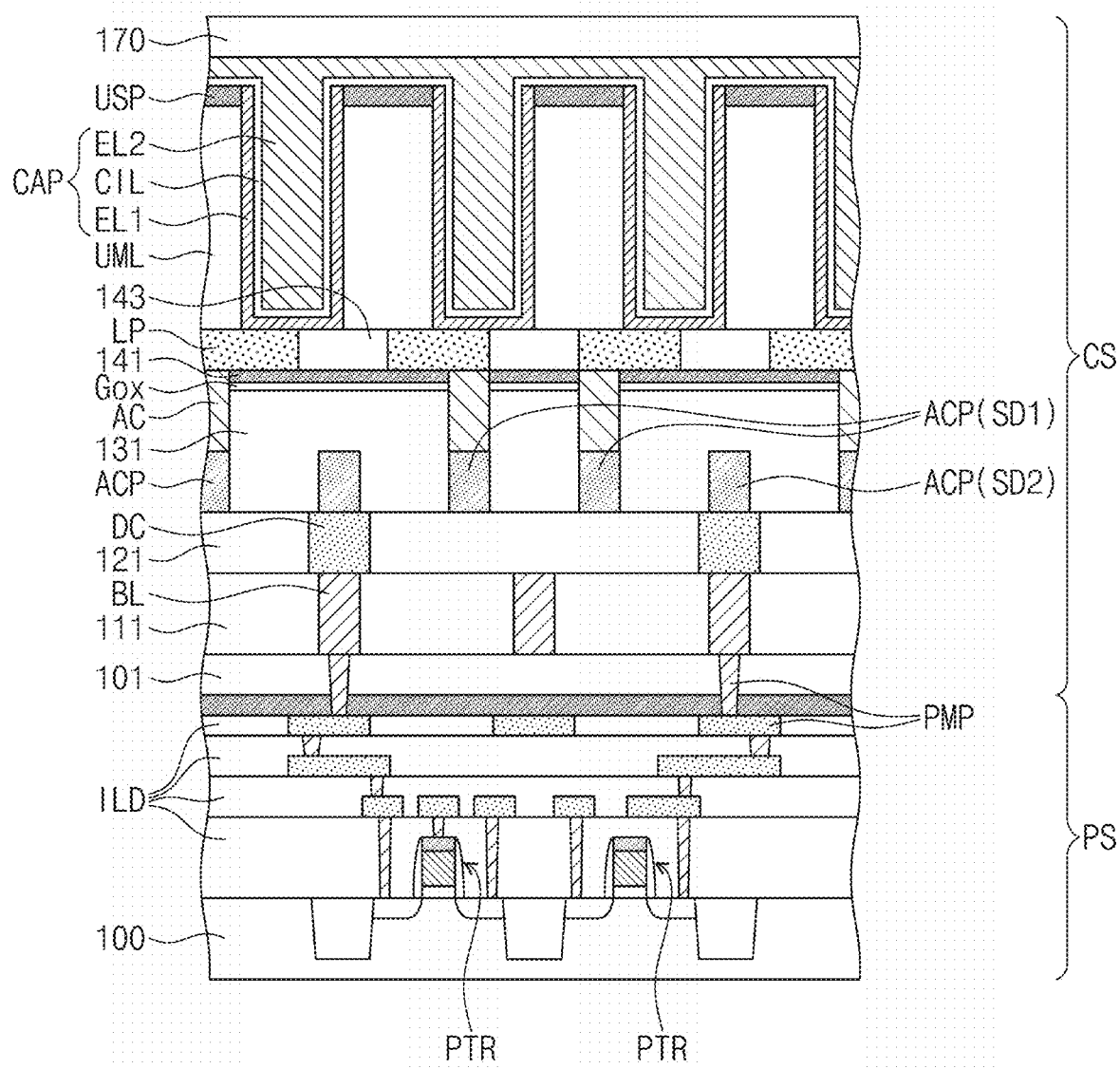
FIG. 9 is a sectional view illustrating a semiconductor memory device according to an embodiment of inventive concepts.

FIG. 9 is a sectional view illustrating a semiconductor memory device according to an embodiment of inventive concepts.

Referring to FIG. 9, the semiconductor memory device may include the peripheral circuit structure PS on the semiconductor substrate 100 and the cell array structure CS on the peripheral circuit structure PS.

The cell array structure CS may include the bit lines BL, the active patterns ACP, the word lines WL, and the capacitors CAP, which are sequentially stacked on the semiconductor substrate 100, as previously described with reference to FIGS. 7, 8A, and 8B.

The peripheral circuit structure PS may be disposed between the semiconductor substrate 100 and the first lower insulating layer 101. The peripheral circuit structure PS may include the core and peripheral circuits PTR, which are formed on the semiconductor substrate 100, lower insulating layers ILD, which are stacked between the semiconductor substrate 100 and the lower insulating layer 101 to cover the core and peripheral circuits PTR, and the peripheral metal structures PMP, which are disposed in the lower insulating layers ILD. The peripheral metal structures PMP may include at least two metal patterns and metal plugs connecting the metal patterns.

The bit lines BL of the cell array structure CS may be connected to the core and peripheral circuits PTR through the peripheral metal structures PMP. Since the bit lines BL are disposed adjacent to the peripheral circuit structure PS, a length of an electric connection path between the bit lines BL and the core and peripheral circuits PTR may be reduced.

FIGS. 10A to 17A and FIGS. 10B to 17B are sectional views, which are respectively taken along the lines A-A', B-B', C-C', and D-D' of FIG. 4 to illustrate a method of fabricating a semiconductor memory device according to an embodiment of inventive concepts.

Figure 10A:
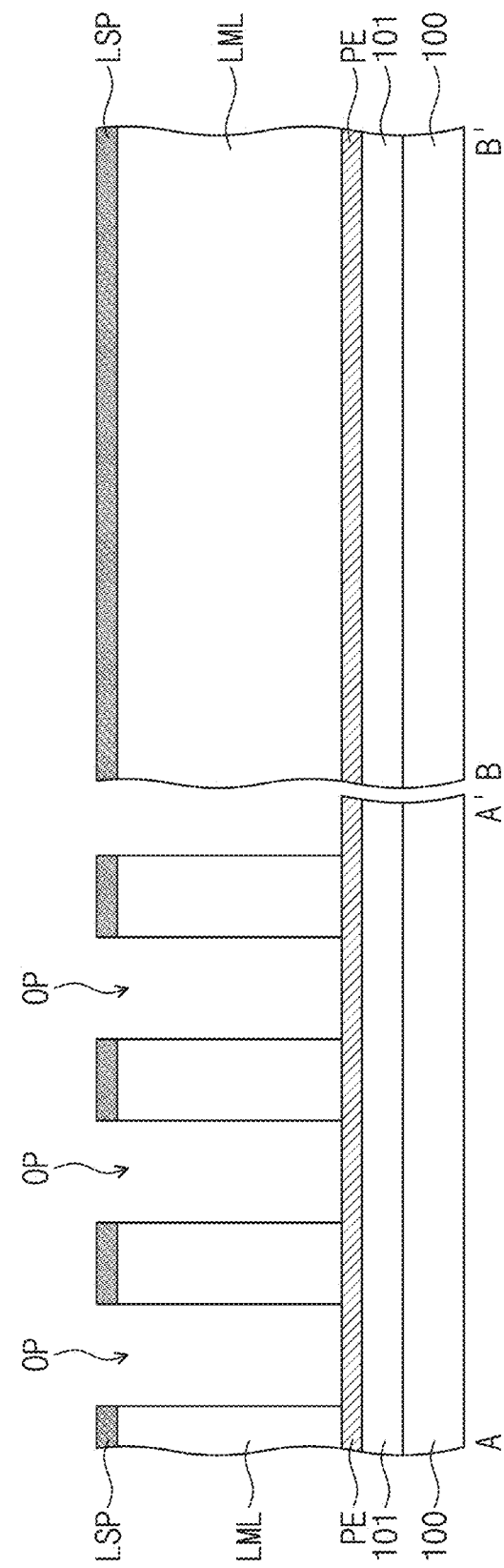
Figure 10B:
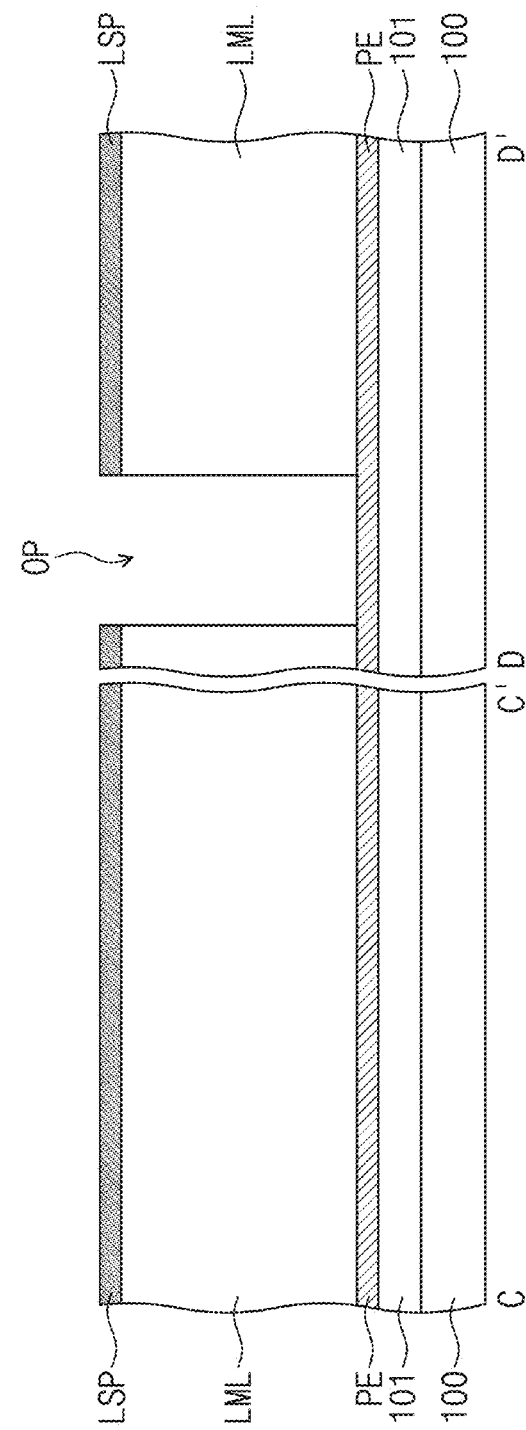

Referring to FIGS. 4, 10A, and 10B, the lower insulating layer 101 and the plate conductive layer PE may be sequentially stacked on the semiconductor substrate 100.

The plate conductive layer PE may cover a top surface of the lower insulating layer 101. The plate conductive layer PE may have a plate shape extending in the first and second directions D1 and D2. The plate conductive layer PE may be formed of or include at least one of, for example, doped polysilicon, metals, conductive metal nitrides, conductive metal silicides, conductive metal oxides, or combinations thereof. For example, the plate conductive layer PE may be formed of or include at least one of Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but inventive concepts are not limited to this example. The plate conductive layer PE may be formed using a deposition process (e.g., a chemical vapor deposition (CVD) process or a physical vapor deposition (PVD) process).

A mold structure, which includes the lower mold layer LML and the lower supporting layer LSP sequentially stacked, may be formed on the plate conductive layer PE.

The lower mold layer LML may be formed of or include at least one of, for example, silicon oxide or silicon oxynitride. The lower mold layer LML may be formed using a deposition process (e.g., a chemical vapor deposition (CVD) process or a physical vapor deposition (PVD) process).

The lower supporting layer LSP may be formed of a material having an etch selectivity with respect to the lower mold layer LML. In an embodiment, the lower supporting layer LSP may be formed using one of SiN, SiCN, TaO, or $TiO_2$. In an embodiment, the lower supporting layer LSP may be omitted.

The mold structure may have openings OP exposing the plate conductive layer PE. The formation of the openings OP may include a mask pattern (not shown) with opened portions on the lower supporting layer LSP and anisotropically etching the lower supporting layer LSP and the lower mold layer LML using the mask pattern. The openings OP may be arranged in a zigzag or honeycomb shape.

The capacitors CAP (see FIGS. 11A and 11B), which serve as data storage devices, may be formed in the openings OP. In an embodiment, the formation of the capacitors CAP may include forming the first electrodes EL1 in the openings OP, forming the capacitor dielectric layer CIL to conformally cover the inner surfaces of the first electrodes EL1, and forming the second electrodes EL2 in the openings OP provided with the capacitor dielectric layer CIL.

Here, the formation of the first electrodes EL1 may include forming a first electrode layer to conformally cover a surface of the mold structure with the openings OP, forming a sacrificial layer (not shown) to fill the openings OP provided with the first electrode layer, planarizing the first electrode layer to expose the top surface of the lower supporting layer LSP and to separate the first electrodes EL1 from each other, and removing the sacrificial layer from the openings OP. According to the afore-described method, each of the first electrodes EL1 may have a cylinder shape having a bottom portion, which is in contact with the plate conductive layer PE, and sidewall portions, which are extended from opposite ends of the bottom portion. Alternatively, each of the first electrodes EL1 may be formed to have a pillar shape.

The capacitor dielectric layer CIL may cover the inner surfaces of the first electrodes EL1 to a uniform thickness in the openings OP and may be extended to a top surface of the mold structure (e.g., the top surface of the lower supporting layer LSP). The capacitor dielectric layer CIL may be formed using a deposition process having a good step coverage property, such as a chemical vapor deposition (CVD), a physical vapor deposition (PVD), or an atomic layer deposition (ALD).

The capacitor dielectric layer CIL may be formed of at least one selected from the group consisting of metal oxides (e.g., $HfO_2$, $ZrO_2$, $Al_2O_3$, $La_2O_3$, $Ta_2O_3$, and $TiO_2$) and perovskite dielectric materials (e.g., $SrTiO_3$ (STO), (Ba,Sr)$TiO_3$ (BST), $BaTiO_3$, PZT, and PLZT) and may have a single- or multi-layered structure.

The formation of the second electrodes EL2 may include depositing a conductive layer to fill the openings OP provided with the first electrodes EL1 and the capacitor dielectric layer CIL and planarizing a top surface of the conductive layer to expose the capacitor dielectric layer CIL. The second electrodes EL2 may have a pillar shape, in the openings OP.

The first electrodes EL1 and the second electrodes EL2 may be formed of or include at least one of high melting point metals (e.g., cobalt, titanium, nickel, tungsten, and molybdenum) and/or metal nitrides (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN)).

Figure 12A:
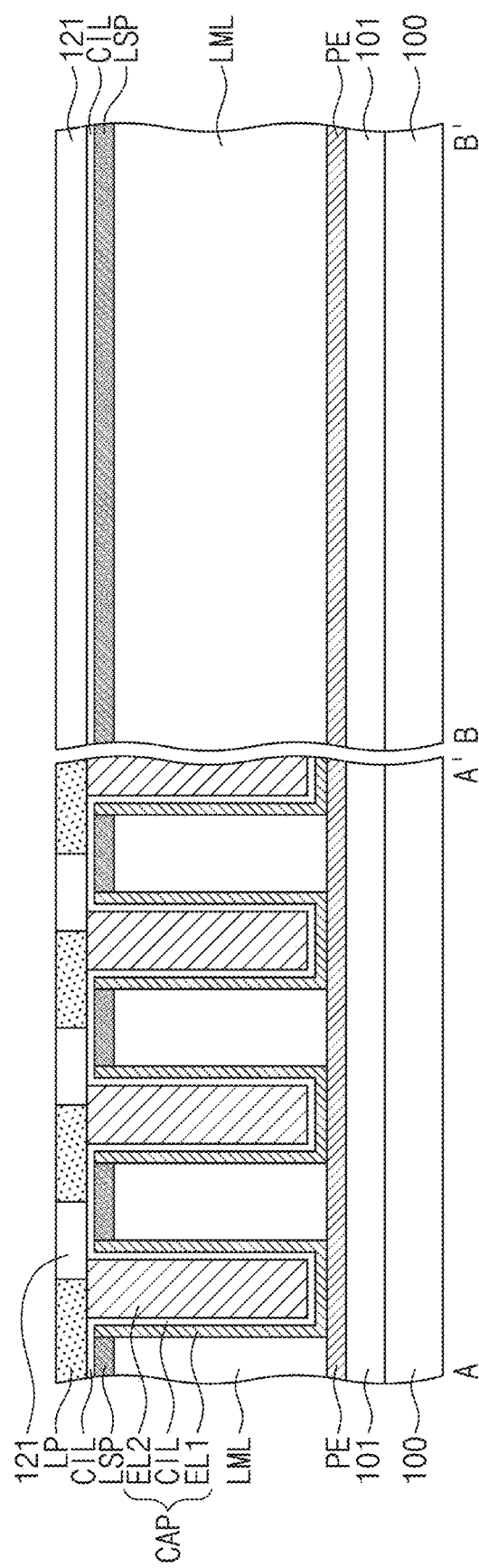
Figure 12B:
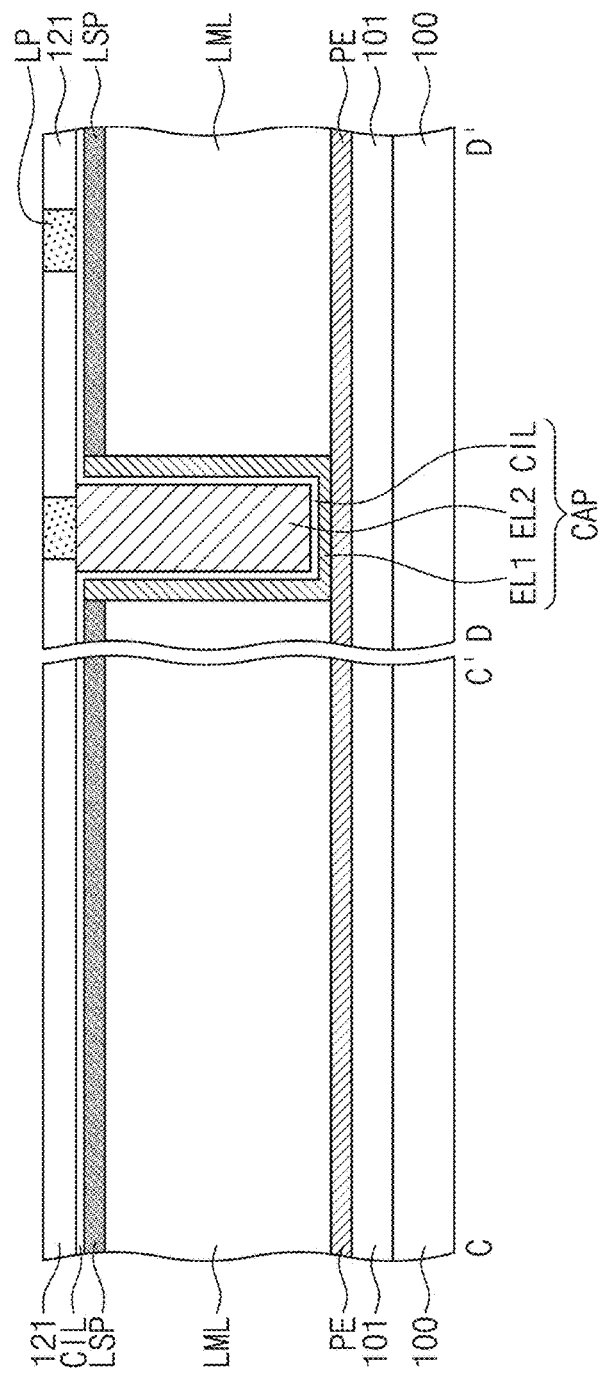

Referring to FIGS. 4, 12A, and 12B, the interlayer insulating layer 121 may be formed on the mold structure to cover the second electrodes EL2 and the capacitor dielectric layer CIL. Next, the contact pads LP, which are respectively connected to the second electrodes EL2, may be formed in the interlayer insulating layer 121. The contact pads LP may have a rectangular, square, circular, or elliptical shape. The contact pads LP may be in contact with portions of the second electrodes EL2, respectively. The contact pads LP may be disposed to be spaced apart from each other in the first and second directions D1 and D2.

The formation of the contact pads LP may include forming contact holes to penetrate the interlayer insulating layer 121 and to expose the second electrodes EL2, respectively, depositing a conductive layer to fill the contact holes, and etching the conductive layer to expose the interlayer insulating layer 121.

An example, in which the interlayer insulating layer 121 is formed before forming the contact pads LP, has been described, but inventive concepts are not limited to this example. For example, the interlayer insulating layer 121 may be formed after the formation of the contact pads LP.

Figure 13A:
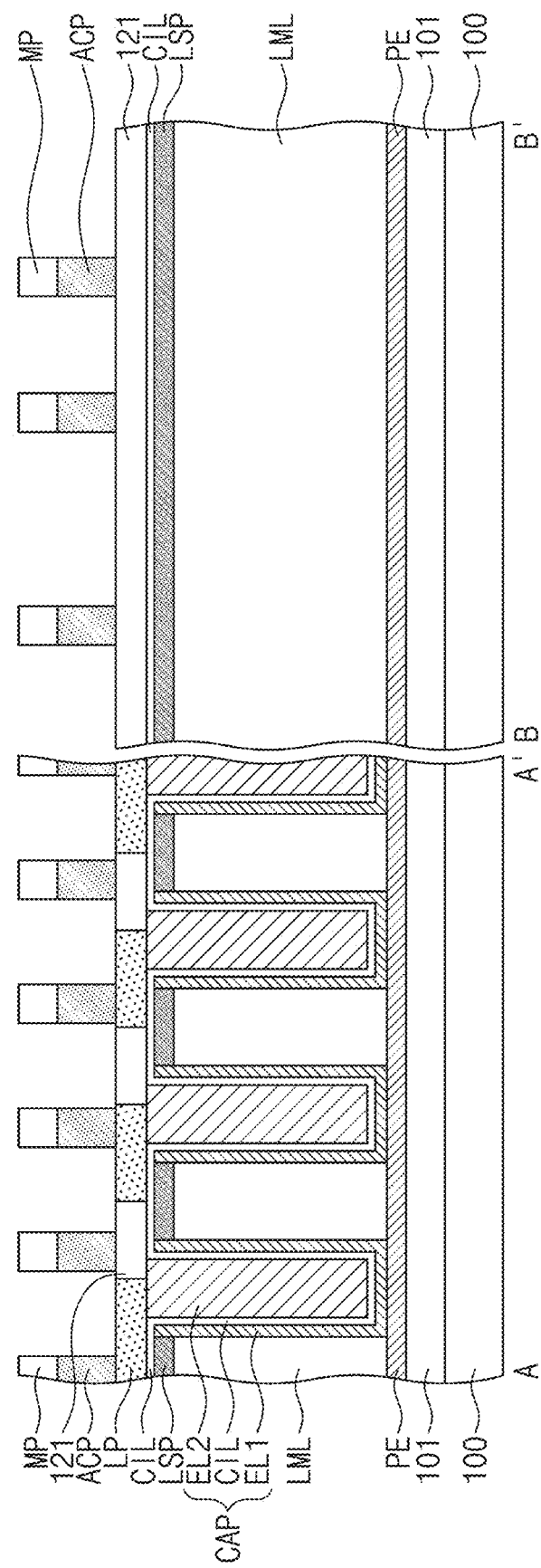
Figure 13B:
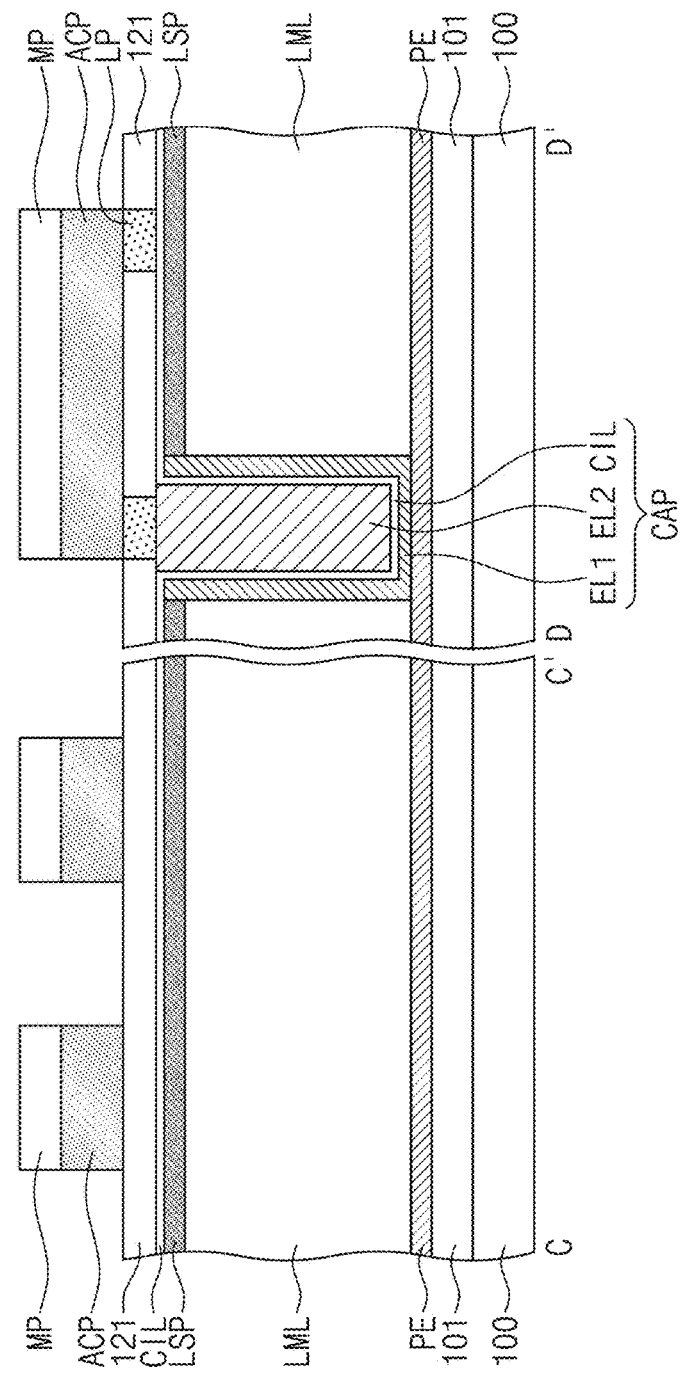

Referring to FIGS. 4, 13A, and 13B, the active patterns ACP may be formed on the interlayer insulating layer 121.

The active patterns ACP may be formed to have a fin shape on the interlayer insulating layer 121. The active patterns ACP may have a rectangular or bar shape and may be two-dimensionally arranged in two different directions (e.g., the first and second directions D1 and D2). When viewed in a plan view, the active patterns ACP may be arranged in a zigzag shape and may have a long axis, which is parallel to a diagonal direction that is oblique to both of the first and second directions D1 and D2. In an embodiment, the active patterns ACP have been described to have the long axis parallel to the diagonal direction and to be arranged in the zigzag shape, but inventive concepts are not limited to this example. The shape and arrangement of the active patterns ACP may be variously changed.

Each of the active patterns ACP may be in contact with a pair of the contact pads LP. Opposite end portions of each of the active patterns ACP may be in contact with the top surfaces of the contact pads LP, and the central portion of the active pattern ACP may be disposed between adjacent ones of the contact pads LP.

The formation of the active patterns ACP may include forming an active layer on the interlayer insulating layer 121, forming hard mask patterns MP on the active layer, and anisotropically etching the active layer using the hard mask patterns MP as an etch mask. After the formation of the active patterns ACP, the hard mask pattern MP may be removed. Alternatively, the hard mask pattern MP may not be removed and may be left.

The active layer may be formed using at least one of physical vapor deposition (PVD), thermal chemical vapor deposition (thermal CVD), low-pressure chemical vapor deposition (LP-CVD), plasma enhanced chemical vapor deposition (PE-CVD), or atomic layer deposition (ALD) technologies.

The active patterns ACP may be formed of or include at least one of semiconductor materials (e.g., silicon, germanium, and silicon-germanium). Alternatively, the active patterns ACP may be formed of or include at least one of oxide semiconductor materials (e.g., $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or combinations thereof). In an embodiment, the active patterns ACP may be formed of or include indium gallium zinc oxide (IGZO). In an embodiment, the active patterns ACP may be formed of or include at least one of two-dimensional semiconductor materials (e.g., metal di-chalcogenide(TMDC)($MX_2$), black phosphorous, $MoS_2$, $MoTe_2$, $WS_2$, $WSe_2$, graphene, carbon nanotube, or combinations thereof).

Figure 14A:
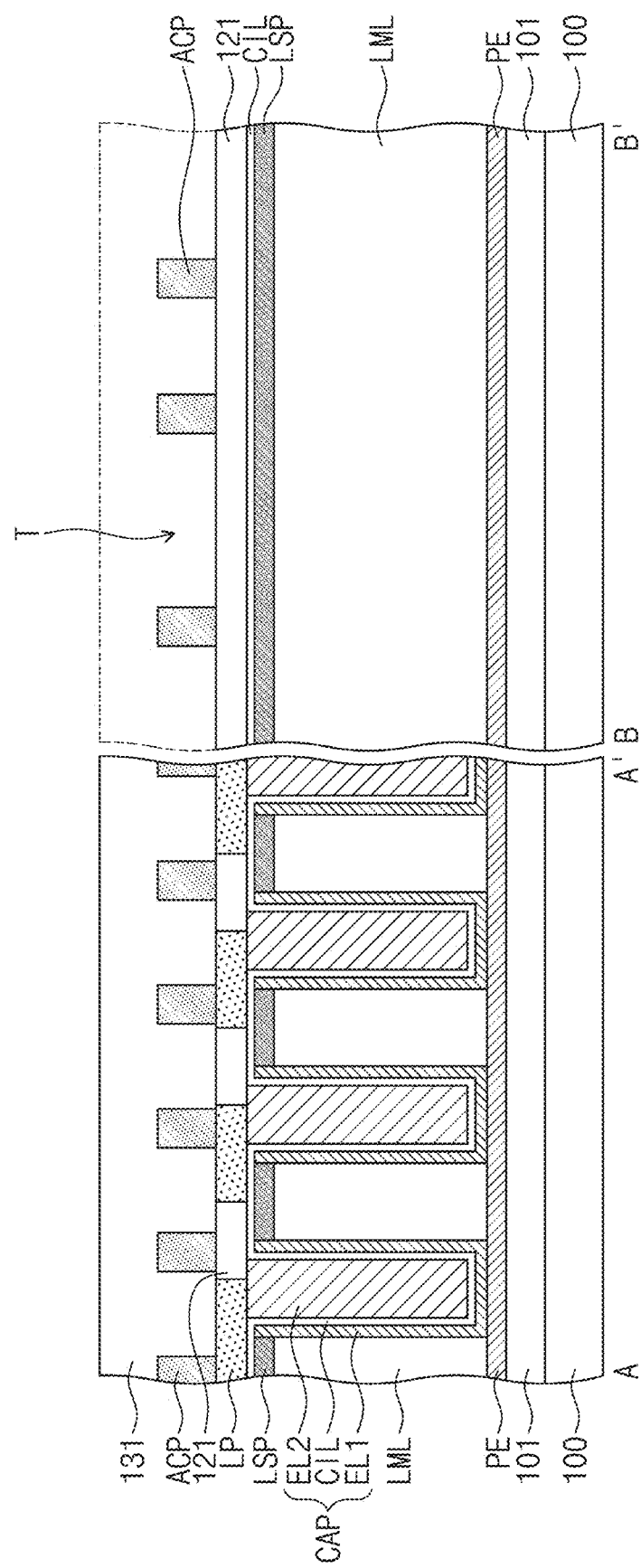
Figure 14B:
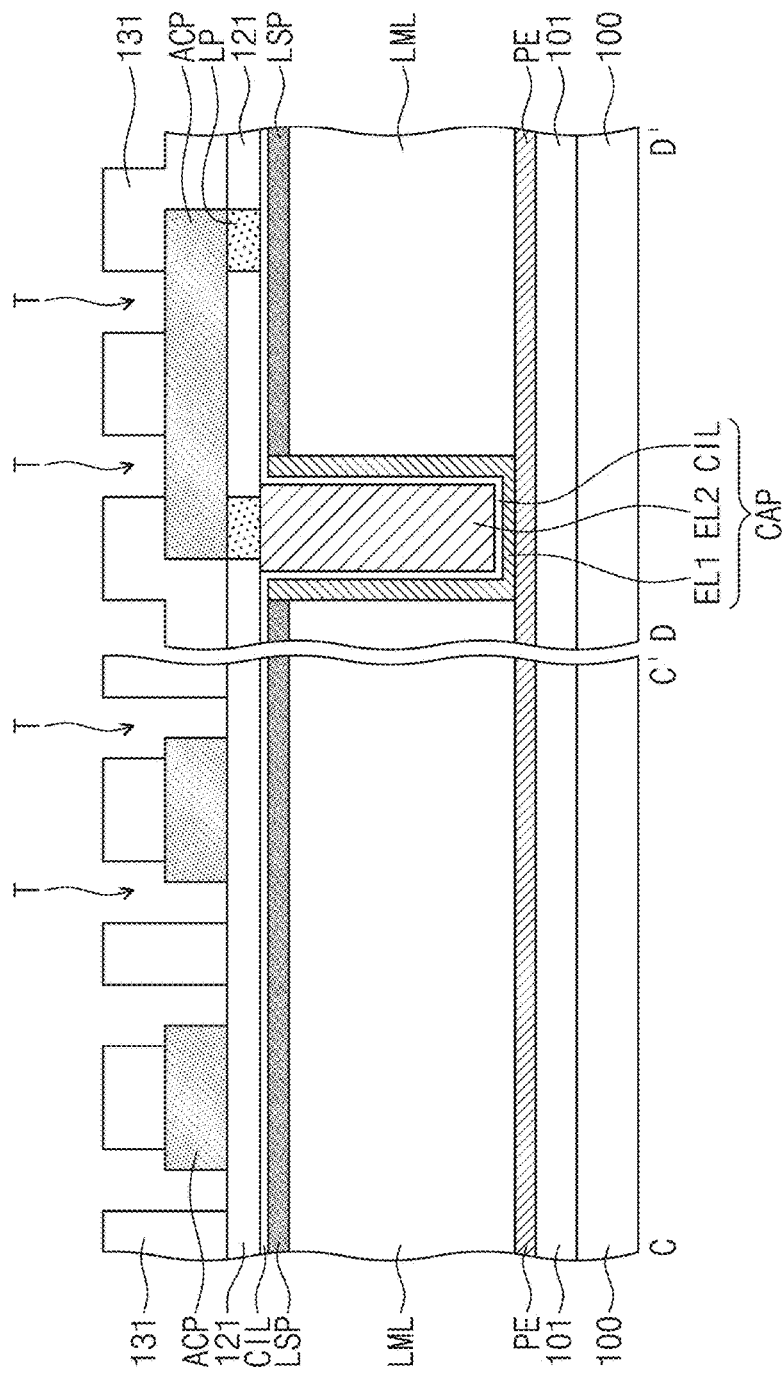

Referring to FIGS. 4, 14A, and 14B, the first upper insulating layer 131 may be formed on the interlayer insulating layer 121 to cover the active patterns ACP.

Next, the first upper insulating layer 131 may be patterned to form trenches T extending in the first direction D1. As an example, a pair of the trenches T may be formed to cross each active pattern ACP. The trenches T may expose side and top surfaces of the active patterns ACP (e.g., of the channel regions).

Figure 15A:
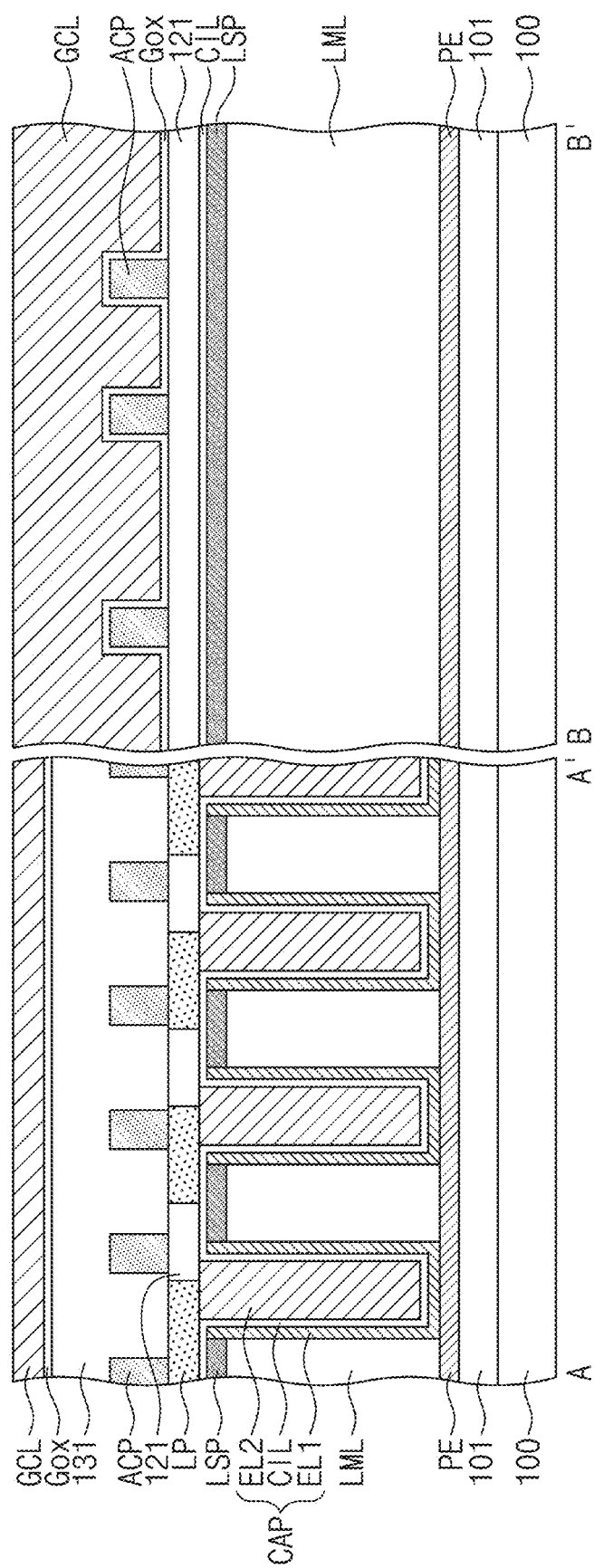
Figure 15B:
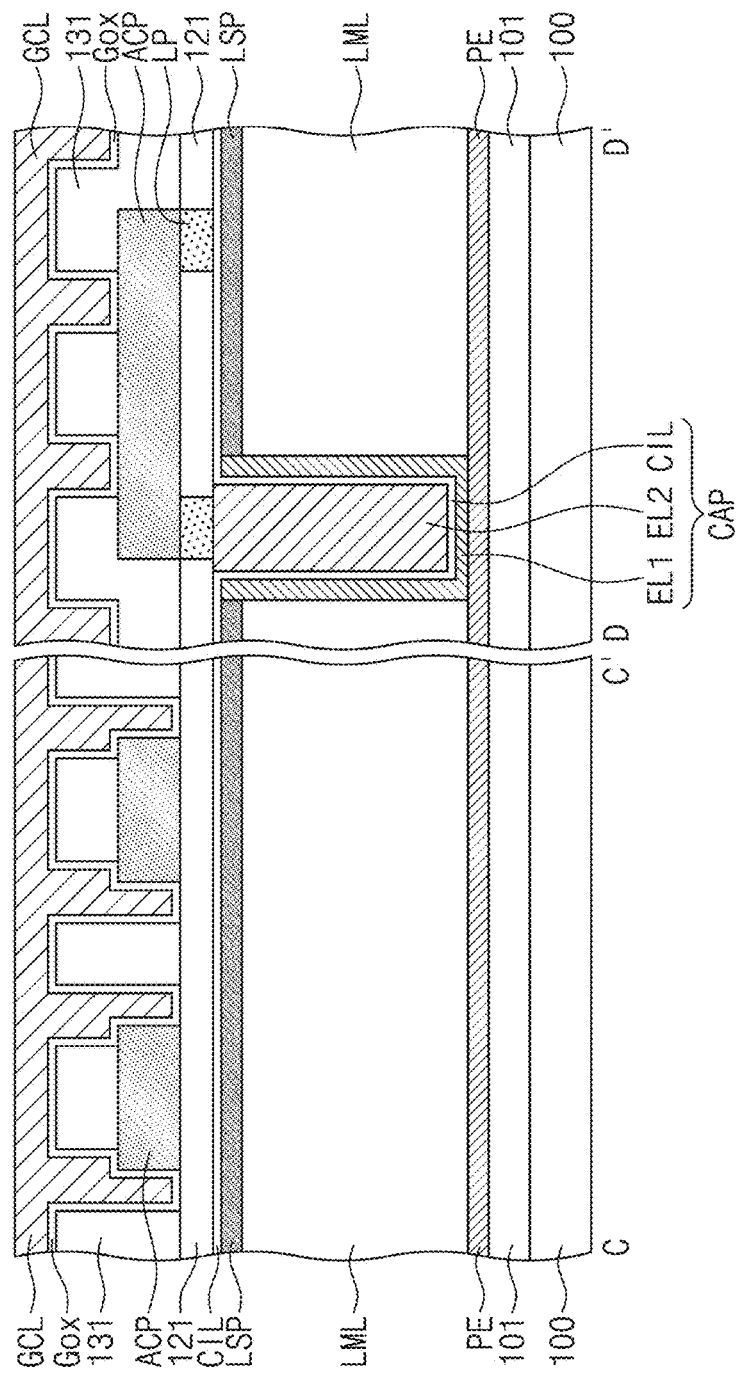

Referring to FIGS. 4, 15A, and 15B, the gate insulating layer Gox and a gate conductive layer GCL may be sequentially formed in the trenches T.

The gate insulating layer Gox and the gate conductive layer GCL may be formed using at least one of physical vapor deposition (PVD), thermal chemical vapor deposition (thermal CVD), low-pressure chemical vapor deposition (LP-CVD), plasma enhanced chemical vapor deposition (PE-CVD), or atomic layer deposition (ALD) technologies.

The gate insulating layer Gox may cover the side and top surfaces of the active patterns ACP to a substantially uniform thickness. The thickness of the gate insulating layer Gox may be smaller than half of the width of the trench T.

The gate conductive layer GCL may be formed to fully fill the trenches T provided with the gate insulating layer Gox. The gate conductive layer GCL may be formed of or include at least one of high melting point metals (e.g., cobalt, titanium, nickel, tungsten, and molybdenum) and/or metal nitrides (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN)).

Figure 16A:
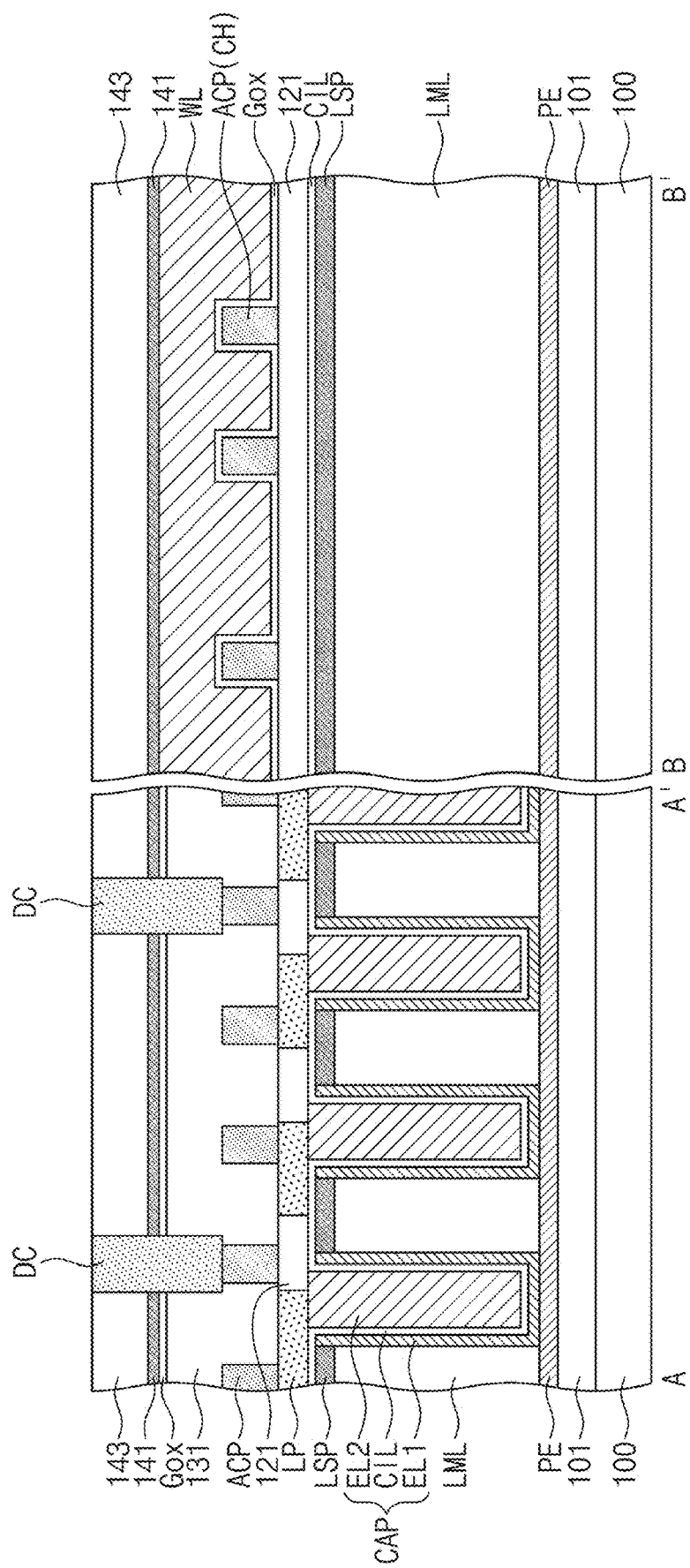
Figure 16B:
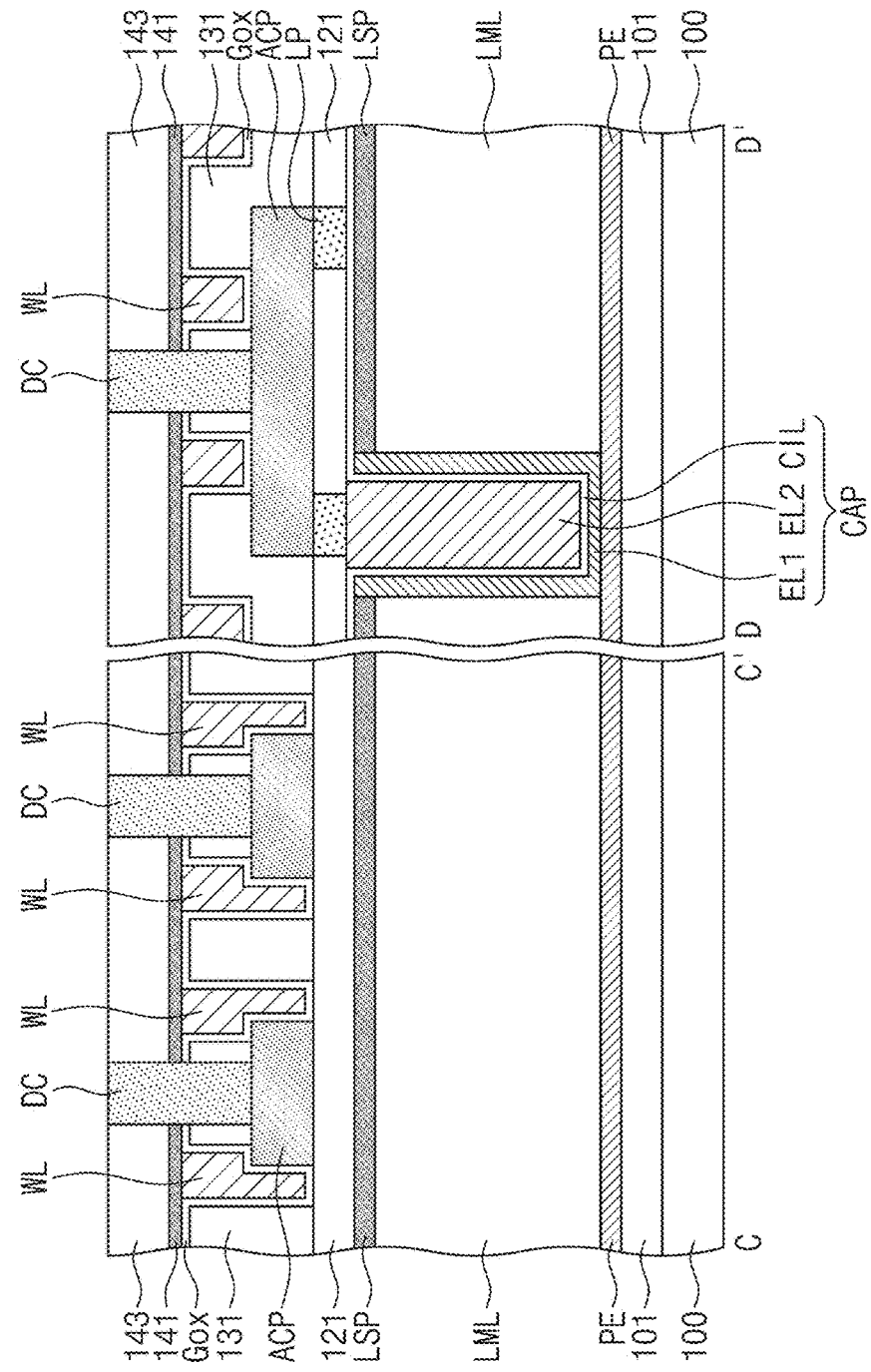

Referring to FIGS. 4, 16A, and 16B, an anisotropic etching process may be performed on the gate conductive layer GCL to form the word lines WL in the trenches T, respectively.

After the formation of the word lines WL, the second upper insulating layer 143 may be formed on the first upper insulating layer 131. In addition, the first etch stop layer 141 may be formed between the first upper insulating layer 131 and the second upper insulating layer 143. The first etch stop layer 141 may cover a top surface of the gate insulating layer Gox and the top surfaces of the word lines WL. The first etch stop layer 141 may be formed of an insulating material which is different from the first and second upper insulating layers 131 and 143.

Next, the bit line contact plugs DC may be formed to penetrate the second upper insulating layer 143, the first etch stop layer 141, and the first upper insulating layer 131. The formation of the bit line contact plugs DC may include forming a mask pattern (not shown) on the second upper insulating layer 143, anisotropically etching the second upper insulating layer 143, the first etch stop layer 141, and the first upper insulating layer 131 to form contact holes exposing center portions of the active patterns ACP, depositing a conductive layer to fill the contact holes, and anisotropically etching the conductive layer to expose the second upper insulating layer 143.

The bit line contact plugs DC may be in contact with the top surfaces of the center portions of the active patterns ACP, respectively. Each of the bit line contact plugs DC may be disposed on a corresponding one of the active patterns ACP and between an adjacent pair of the word lines WL.

Figure 17A:
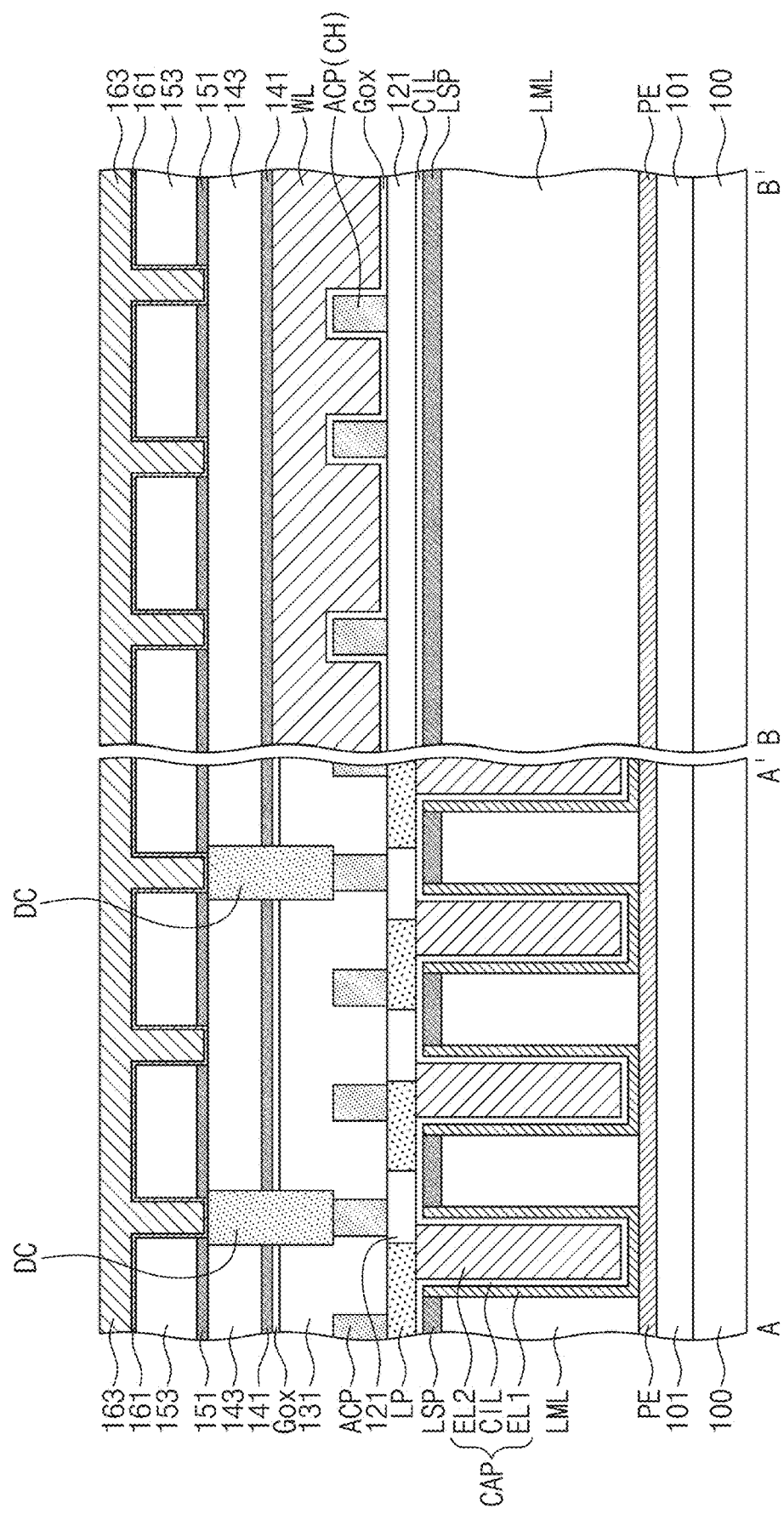
Figure 17B:
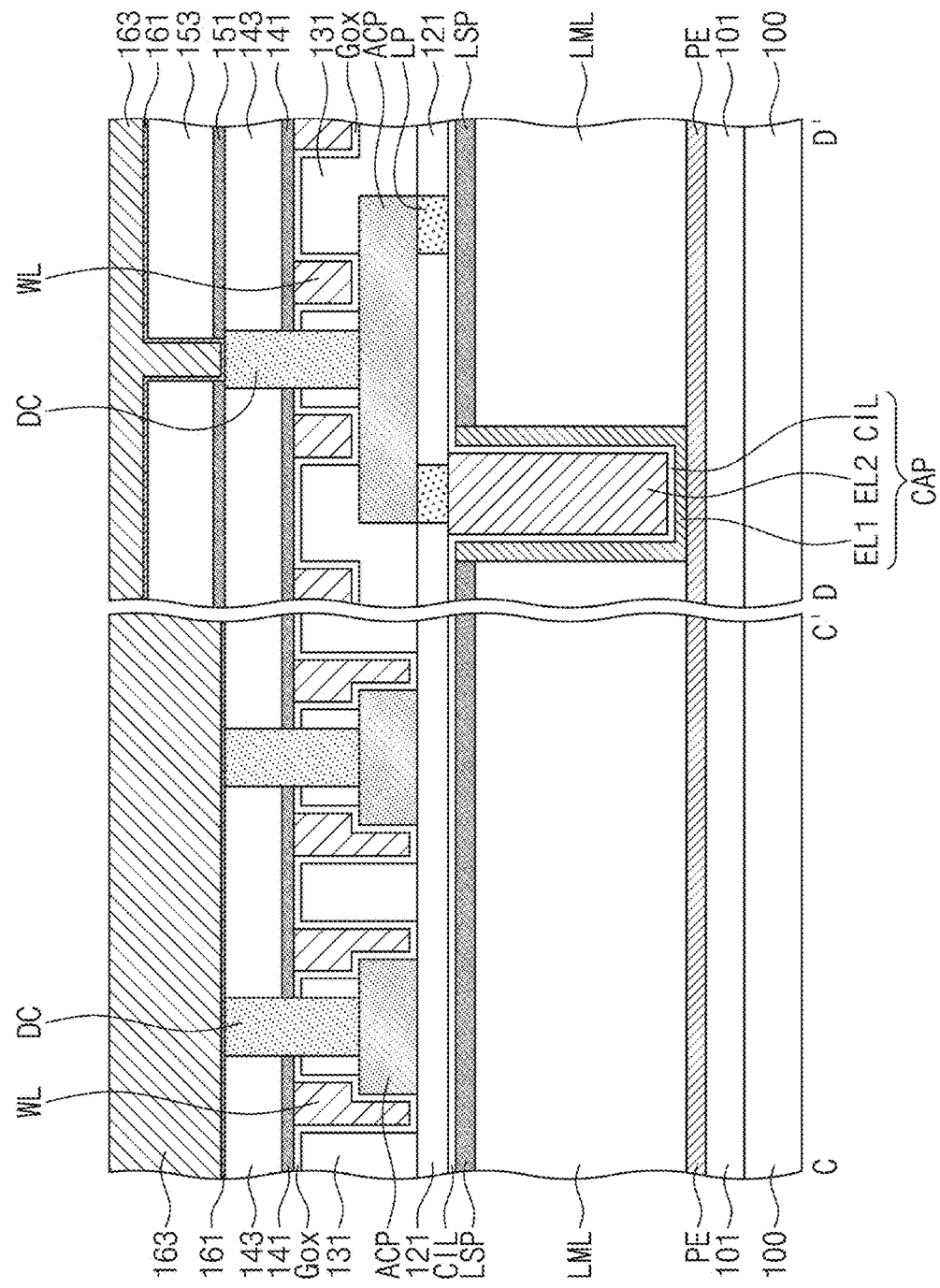

Referring to FIGS. 4, 17A, and 17B, the second etch stop layer 151 and the third upper insulating layer 153 may be sequentially stacked on the second upper insulating layer 143. The second etch stop layer 151 may be formed of or include an insulating material different from the second and third upper insulating layers 143 and 153. The second etch stop layer 151 may cover the top surfaces of the bit line contact plugs DC.

Next, bit line trenches may be formed by patterning the second etch stop layer 151 and the third upper insulating layer 153. The bit line trenches may be extended in the second direction D2. Each of the bit line trenches may be configured to expose the top surfaces of the bit line contact plugs DC, which are arranged in the second direction D2.

After the formation of the bit line trenches, a barrier metal layer 161 and a bit line metal layer 163 may be sequentially formed. The barrier metal layer 161 may cover the bit line trenches and the top surface of the third upper insulating layer 153 to a uniform thickness. The barrier metal layer 161 may be formed of or include at least one of metal nitrides (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and tungsten nitride (WN)).

The bit line metal layer 163 may be formed on the barrier metal layer 161 to fully fill the bit line trenches provided with the barrier metal layer 161. The bit line metal layer 163 may be formed of or include at least one of metallic materials (e.g., copper, aluminum, cobalt, titanium, nickel, tungsten, tantalum, and molybdenum).

Next, the barrier metal layer 161 and the bit line metal layer 163 may be anisotropically etched to expose the top surface of the third upper insulating layer 153, and as a result, the bit lines BL may be formed to have the structure of FIGS. 5A and 5B.

FIGS. 18A to 23A and FIGS. 18B to 23B are sectional views, which are respectively taken along the lines A-A', B-B', C-C', and D-D' of FIG. 7 to illustrate a method of fabricating a semiconductor memory device according to an embodiment of inventive concepts.

Figure 18A:
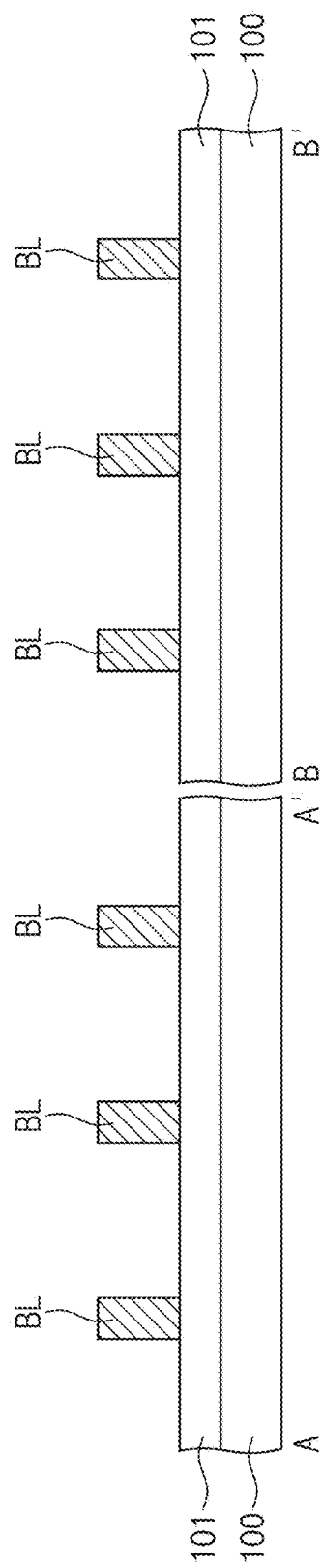
Figure 18B:
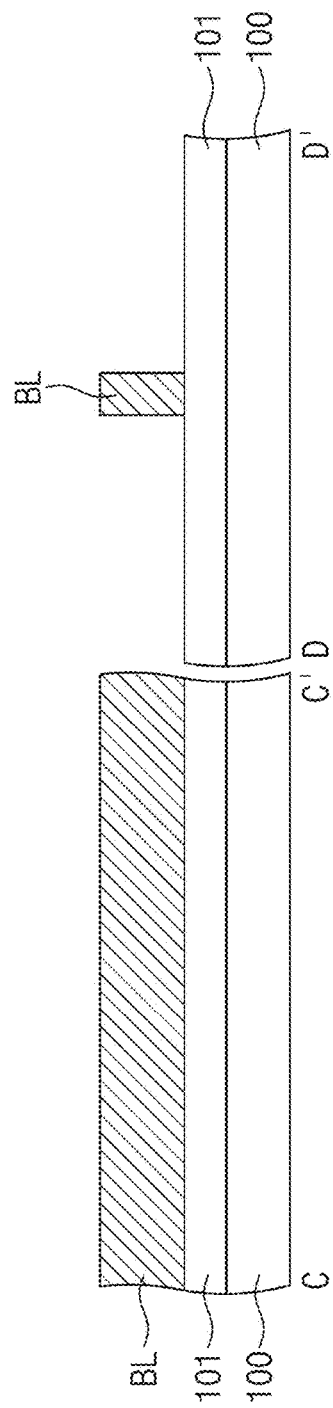

Referring to FIGS. 7, 18A, and 18B, the first lower insulating layer 101 may be formed on the semiconductor substrate 100. In an embodiment, the first lower insulating layer 101 may cover the core and peripheral circuits, which are formed on the semiconductor substrate 100.

The bit lines BL may be formed on the first lower insulating layer 101. The formation of the bit lines BL may include depositing a bit line conductive layer on the first lower insulating layer 101 and patterning the bit line conductive layer. The bit lines BL may be extended in the second direction D2 to be parallel to each other.

Figure 19A:
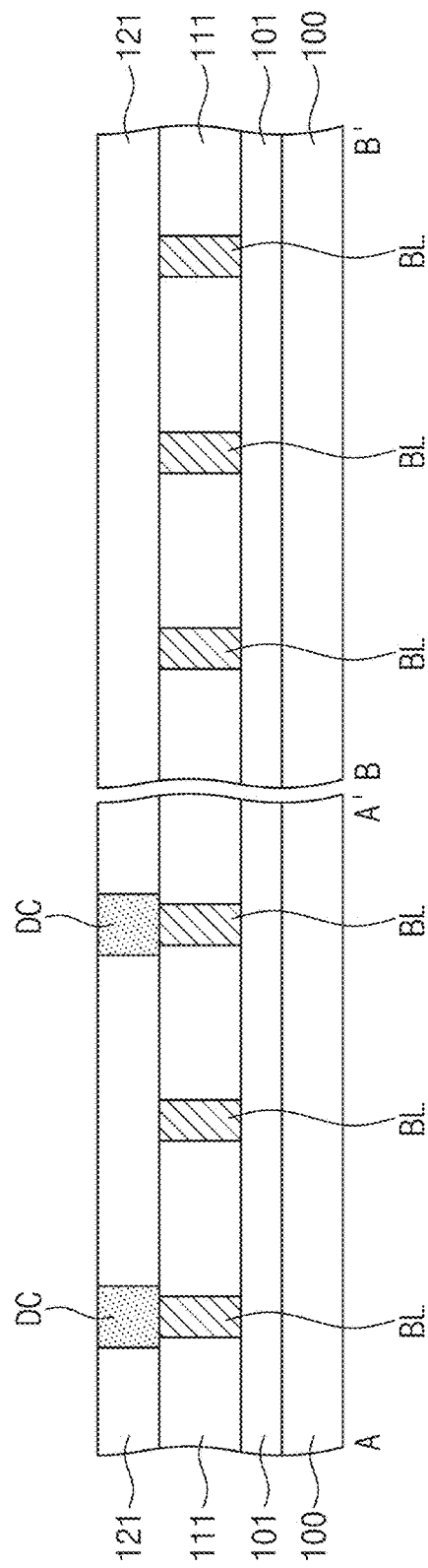
Figure 19B:
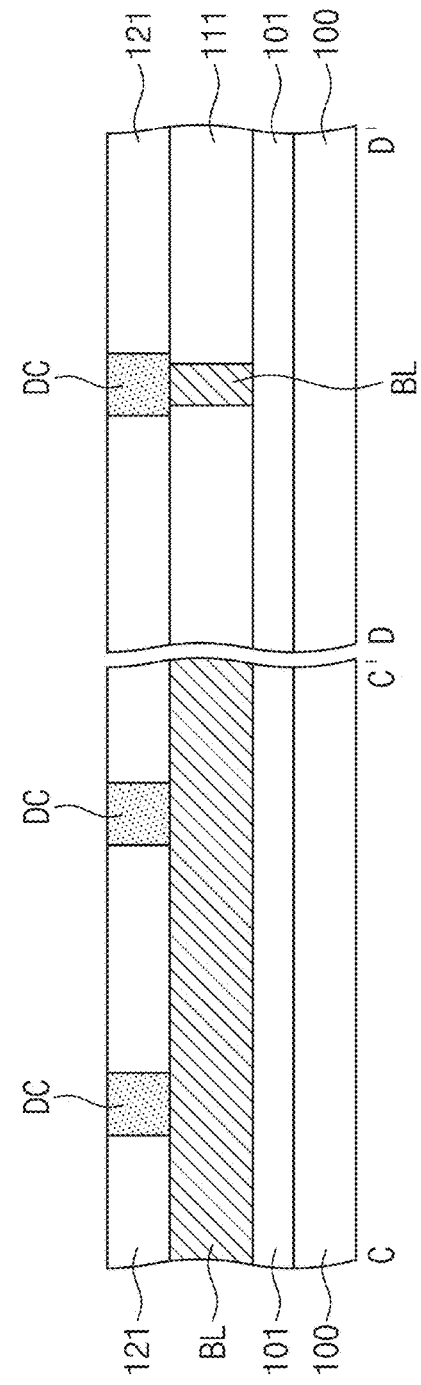

Referring to FIGS. 7, 19A, and 19B, the second lower insulating layer 111 may be formed on the first lower insulating layer 101 to fill regions between the bit lines BL.

The interlayer insulating layer 121 may be formed on the second lower insulating layer 111, and in an embodiment, the bit line contact plugs DC may be formed in the interlayer insulating layer 121.

The bit line contact plugs DC may be in contact with the top surfaces of the bit lines BL. The bit line contact plugs DC may be arranged to be spaced apart from each other in the first and second directions D1 and D2 and may be arranged in a zigzag shape.

Referring to FIGS. 7, 20A, and 20B, the active patterns ACP may be formed on the interlayer insulating layer 121. The active patterns ACP may be formed to have a fin shape on the interlayer insulating layer 121, as previously described with reference to FIGS. 13A and 13B. The active patterns ACP may have a rectangular or bar shape and may have a long axis, which is parallel to a diagonal direction that is oblique to both of the first and second directions D1 and D2.

In an embodiment, the active patterns ACP may be in contact with the top surfaces of the bit line contact plugs DC, respectively. The bit line contact plugs DC may be connected to center portions of the active patterns ACP, respectively. The active patterns ACP may be formed of at least one of semiconductor materials, oxide semiconductor materials, or two-dimensional semiconductor materials, as described above.

Figure 21A:
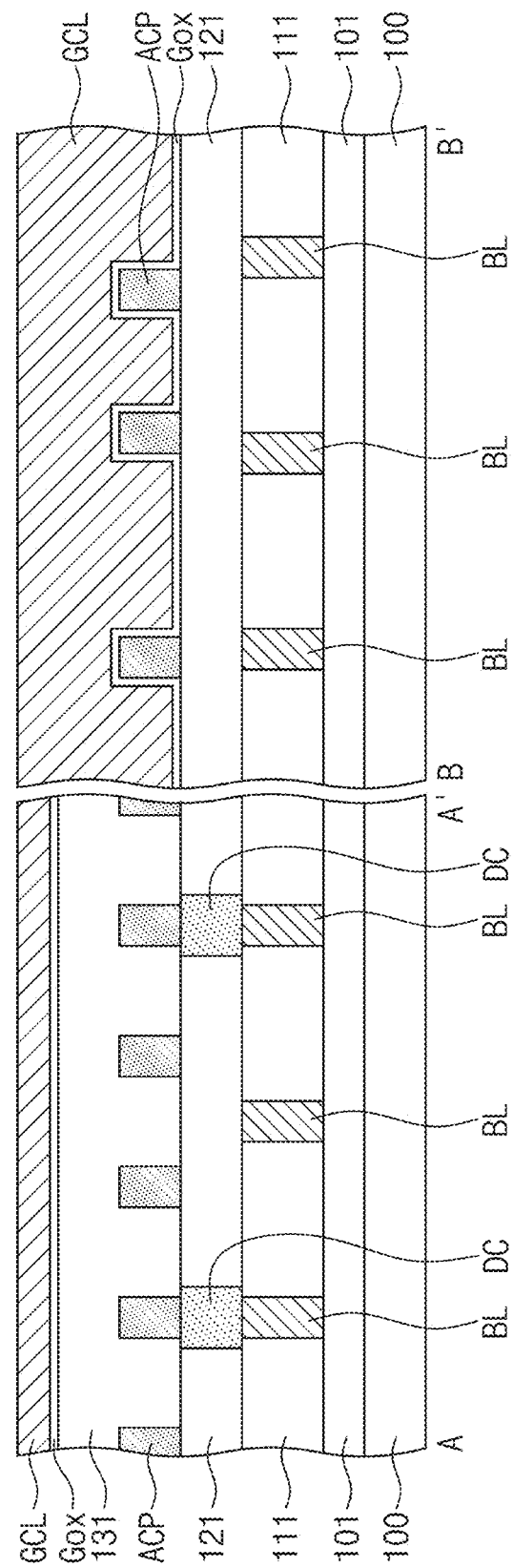
Figure 21B:
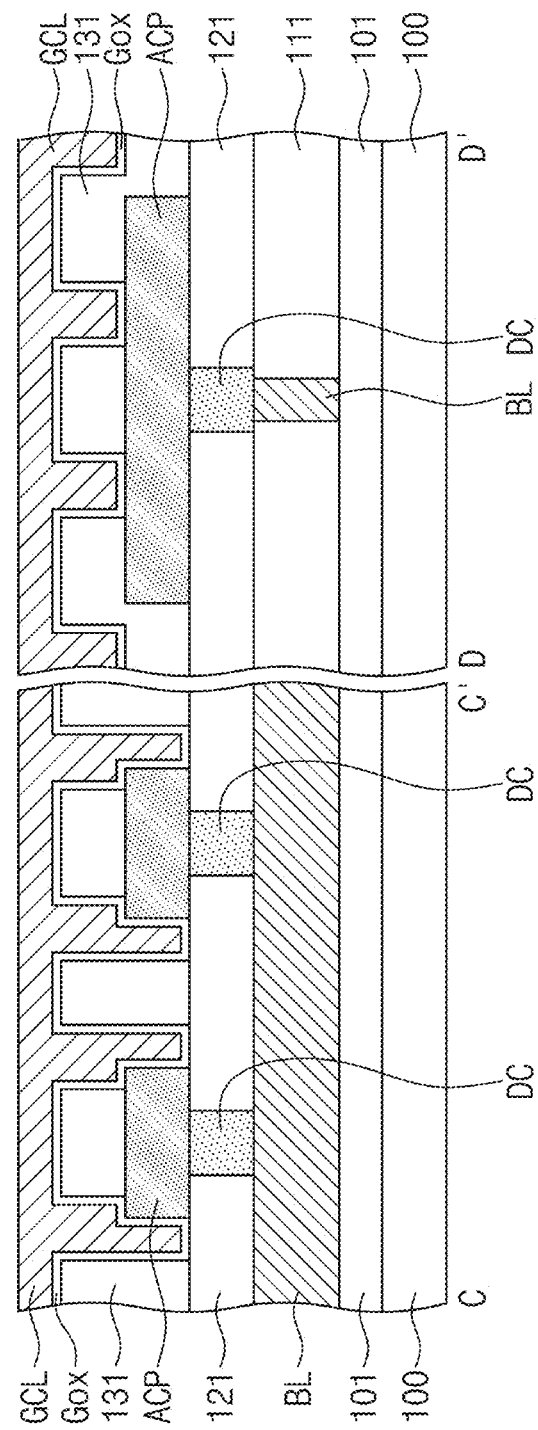

Referring to FIGS. 7, 21A, and 21B, the first upper insulating layer 131 may be formed on the interlayer insulating layer 121 to cover the active patterns ACP. Next, trenches may be formed in the first upper insulating layer 131, as previously described with reference to FIGS. 14A and 14B. In other words, the trench may be extended in the first direction D1 to cross the active patterns ACP.

Next, as described with reference to FIGS. 15A and 15B, the gate insulating layer Gox and the gate conductive layer GCL may be sequentially formed in the trenches.

Figure 22A:
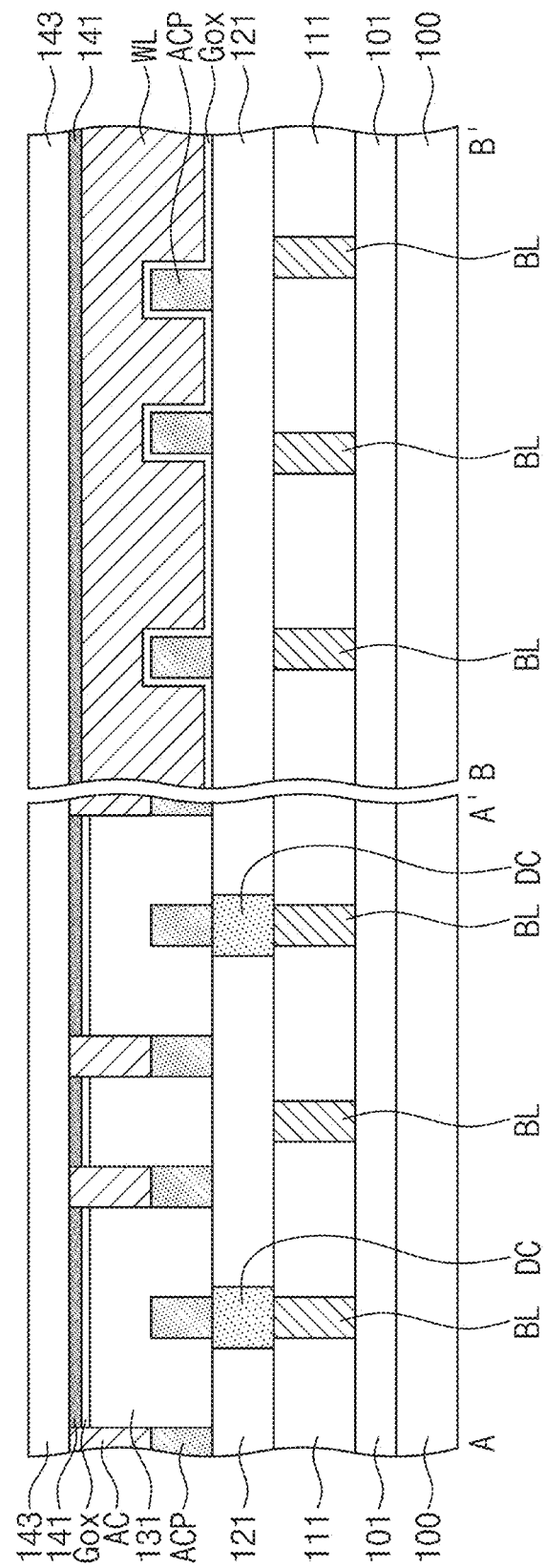
Figure 22B:
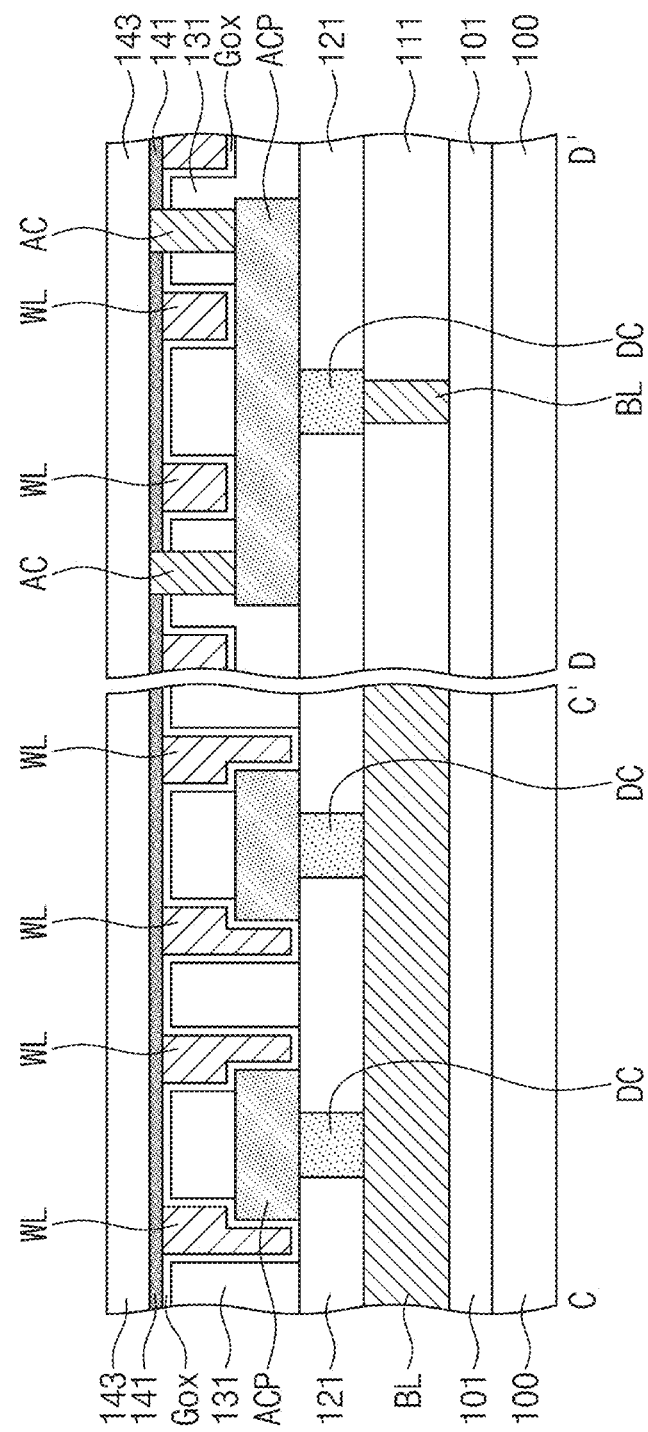

Referring to FIGS. 7, 22A, and 22B, an anisotropic etching process may be performed on the gate conductive layer GCL to form the word lines WL in the trenches T, respectively.

After the formation of the word lines WL, the first etch stop layer 141 may be formed to cover the top surface of the gate insulating layer Gox and the top surfaces of the word lines WL.

Next, active contact AC may be formed to penetrate the first etch stop layer 141 and to be coupled to the active patterns ACP. The active contact AC may be coupled to opposite end portions of each of the active patterns ACP and may be in contact with the top surface of the active pattern ACP.

After the formation of the active contact AC, the second upper insulating layer 143 may be formed on the first etch stop layer 141.

Figure 23A:
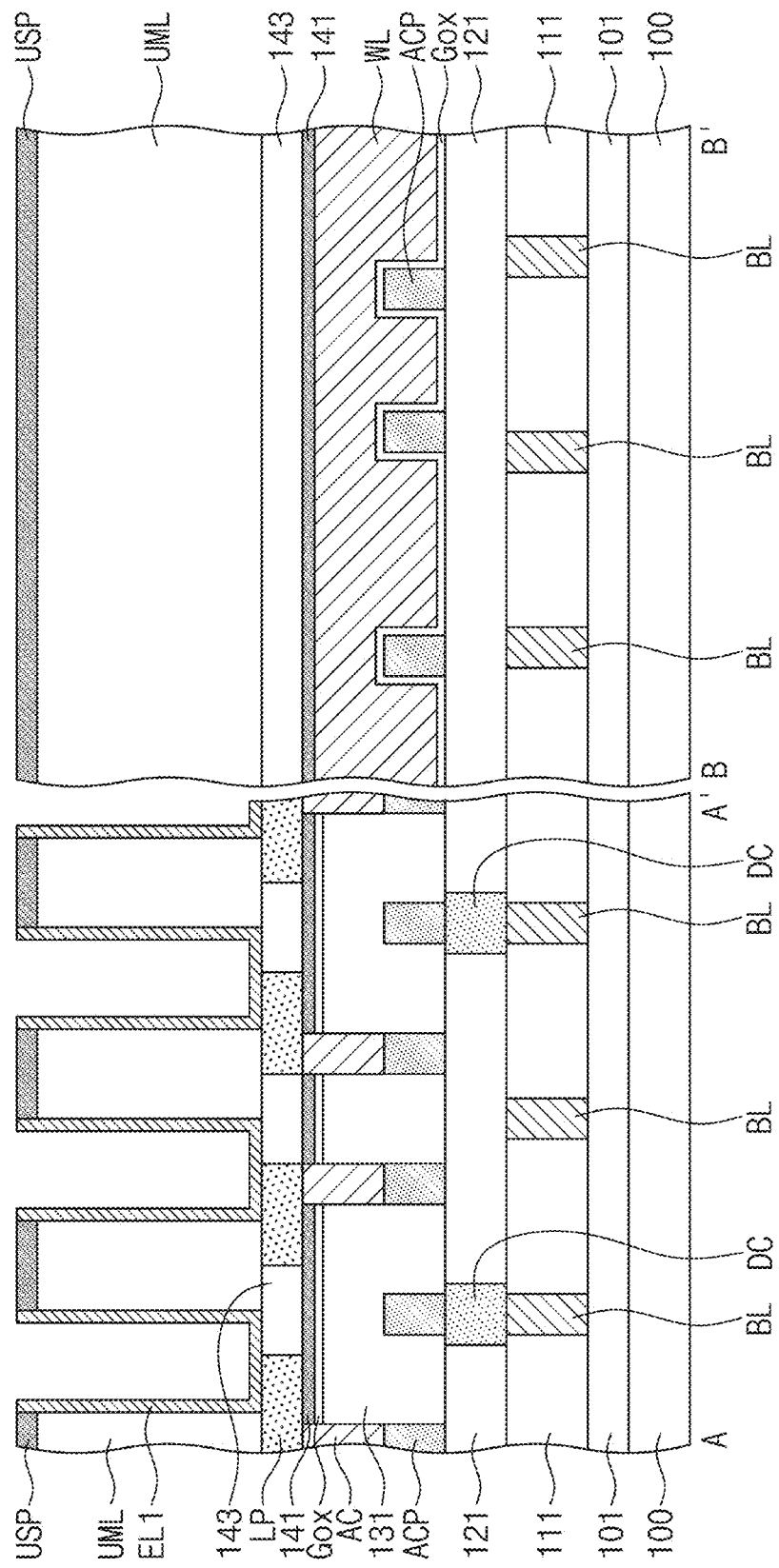
Figure 23B:
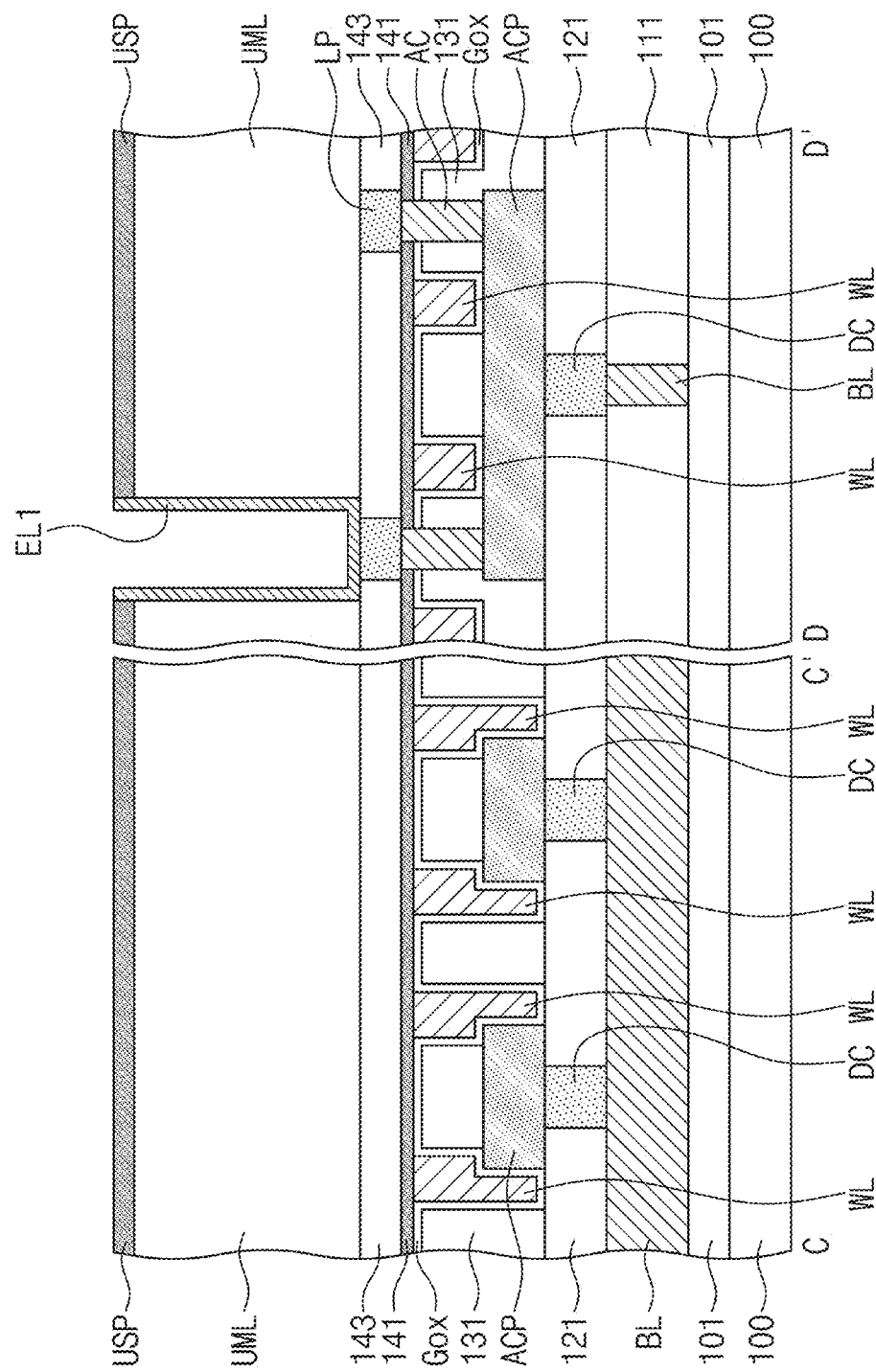

Referring to FIGS. 7, 23A, and 23B, the contact pads LP may be formed in the second upper insulating layer 143 to be coupled to the active contact AC, respectively.

The active contact AC may be in contact with portions of the contact pads LP. The contact pads LP may be disposed to be spaced apart from each other in the first and second directions D1 and D2. The contact pads LP may be located between the word lines WL and between the bit lines BL, when viewed in a plan view.

Next, a mold structure, in which the upper mold layer UML and the upper supporting layer USP are sequentially stacked, may be formed on the second upper insulating layer 143.

The mold structure may have openings exposing the contact pads LP, respectively. As previously described with reference to FIGS. 10A and 10B, the formation of the openings may include forming a mask pattern (not shown) with opened portions on the upper supporting layer USP and anisotropically etching the upper supporting layer USP and the upper mold layer UML using the mask pattern.

Figure 11A:
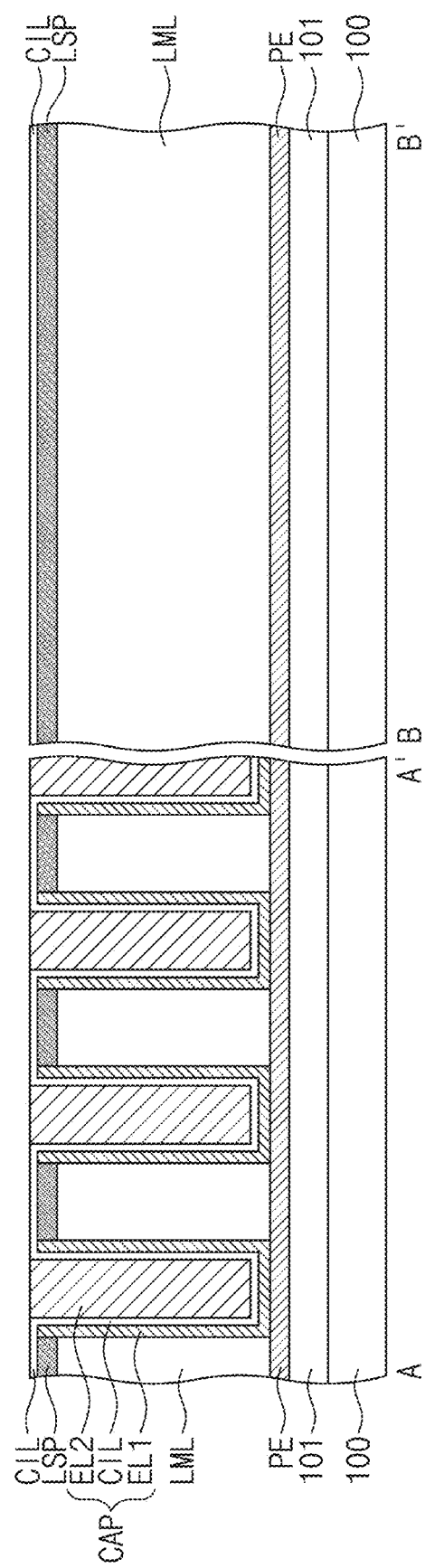
Figure 11B:
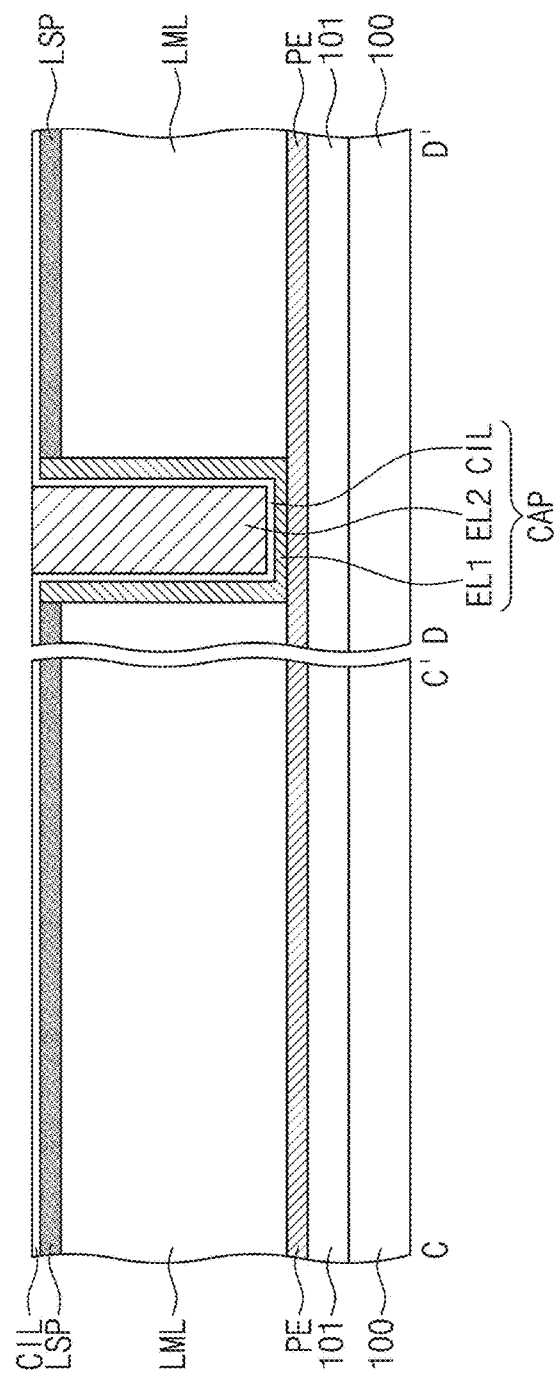

Next, as described with reference to FIGS. 11A and 11B, the first electrodes EL1 may be formed in the openings, respectively.

Referring back to FIGS. 8A and 8B, after the formation of the first electrodes EL1, the capacitor dielectric layer CIL and the second electrode EL2 may be sequentially formed in the openings provided with the first electrodes EL1.

The capacitor dielectric layer CIL may cover the inner surfaces of the first electrodes EL1 to a uniform thickness, in the openings, and may be extended to the top surface of the mold structure (e.g., the top surface of the lower supporting layer LSP).

The second electrode EL2 may be formed on the capacitor dielectric layer CIL to fill the openings. The second electrode EL2 may cover a plurality of the first electrodes EL1 in common.

According to an embodiment of inventive concepts, a fin-shaped transistor may be used as a memory cell transistor. In this case, three surfaces of a fin shaped active pattern may be controlled by a word line, and thus, the word line may have an improved channel control ability. Accordingly, it may be possible to secure a turn-on current, even when an area for a memory cell is reduced. Furthermore, the active pattern may be formed of an oxide semiconductor material, and in this case, it may be possible to reduce a leakage current of the memory cell transistor during an operation of a semiconductor memory device.

In addition, since capacitors or bit lines are buried below the memory cell transistors, it may be possible to omit conductive structures from regions between the bit lines or between the word lines. Accordingly, it may be possible to reduce complexity in a process of fabricating a semiconductor memory device. Furthermore, since the capacitors or the bit lines are buried below the memory cell transistors, it may be possible to easily dispose peripheral circuits at positions which are vertically overlapped with a cell array. Thus, a semiconductor memory device may be fabricated to have an increased integration density.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
   an interlayer insulating layer;
   an active pattern on the interlayer insulating layer;
   a first word line and a second word line on the interlayer insulating layer and crossing the active pattern, the first word line and the second word line enclosing a side surface of the active pattern and a top surface of the active pattern, and the first word line and the second word line extending in a first direction;
   a first capacitor connected to a first end portion of the active pattern;
   a second capacitor connected to a second end portion of the active pattern;
   a bit line contact plug connected to the active pattern, the bit line contact plug being between the first word line and the second word line; and
   a bit line connected to the bit line contact plug, the bit line extending in a second direction and crossing the first word line and the second word line.

2. The semiconductor memory device of claim 1, wherein,
   a third direction is perpendicular to the first direction and the second direction,
   the active pattern is between the first capacitor and the bit line in the third direction, and
   the active pattern is between the second capacitor and the bit line in the third direction.

3. The semiconductor memory device of claim 1, wherein each of the first word line and the second word line has a first thickness on the active pattern and has a second thickness on the interlayer insulating layer, and
   the second thickness is larger than the first thickness.

4. The semiconductor memory device of claim 1, further comprising:
   a semiconductor substrate below the interlayer insulating layer, wherein
   the interlayer insulating layer is on the semiconductor substrate,
   the first capacitor and the second capacitor are located at a first level from the semiconductor substrate,
   the active pattern is located at a second level, which is higher than the first level, from the semiconductor substrate, and
   the bit line is located at a third level, which is higher than the second level, from the semiconductor substrate.

5. The semiconductor memory device of claim 1, further comprising:
   a lower insulating layer defining openings,
   wherein each of the first capacitor and the second capacitor comprise a first electrode in a corresponding opening of the openings in the lower insulating layer, a second electrode in the corresponding opening of the lower insulating layer in which the first electrode is disposed, and a capacitor dielectric layer between the first electrode and the second electrode, and
   wherein the interlayer insulating layer is between the active pattern and the lower insulating layer.

6. The semiconductor memory device of claim 5, further comprising:
   contact plugs penetrating the interlayer insulating layer, wherein
   the contact plugs are coupled to the second electrode of the first capacitor and the second electrode of the second capacitor, respectively, and
   the contact plugs contact a bottom surface of the active pattern.

7. The semiconductor memory device of claim 1, further comprising:
   a semiconductor substrate below the interlayer insulating layer, wherein
   the interlayer insulating layer is on the semiconductor substrate,
   the bit line is located at a first level from the semiconductor substrate,
   the active pattern is located at a second level, which is higher than the first level, from the semiconductor substrate, and
   the first capacitor and the second capacitor are located at a third level, which is higher than the second level, from the semiconductor substrate.

8. The semiconductor memory device of claim 1, wherein
   the bit line contact plug penetrates the interlayer insulating layer, and
   the bit line contact plug contacts a bottom surface of the active pattern.

9. The semiconductor memory device of claim 1, further comprising:
   a first semiconductor substrate;
   a second semiconductor substrate facing the first semiconductor substrate, the second semiconductor substrate including peripheral circuits integrated thereon;
   first bonding pads; and
   second bonding pads, wherein
   the bit line is one of a plurality of bit lines,
   the first bonding pads are connected to the bit lines,
   the second bonding pads are connected to the peripheral circuits integrated on the second semiconductor substrate,
   the first capacitor and the second capacitor are on the first semiconductor substrate,
   the interlayer insulating layer covers the first capacitor and the second capacitor on the first semiconductor substrate, and
   the first bonding pads are coupled to the second bonding pads.

10. The semiconductor memory device of claim 1, further comprising:

a semiconductor substrate including peripheral circuits integrated on the semiconductor substrate; and
a lower insulating layer covering the peripheral circuits, wherein
the bit line is one of a plurality of bit lines,
the bit lines are connected to the peripheral circuits in the lower insulating layer, and
the interlayer insulating layer is between the active pattern and the lower insulating layer.

* * * * *